(12) United States Patent
Hayashi et al.

(10) Patent No.: US 7,101,591 B2
(45) Date of Patent: Sep. 5, 2006

(54) PRODUCTION METHOD FOR COPOLYMER FILM, COPOLYMER FILM PRODUCED BY THE FORMING METHOD AND SEMICONDUCTOR DEVICE USING COPOLYMER FILM

(75) Inventors: Yoshihiro Hayashi, Minato-ku (JP); Jun Kawahara, Minato-ku (JP)

(73) Assignee: NEC Corporation, Tokyo (JP)

( * ) Notice: Subject to any disclaimer, the term of this patent is extended or adjusted under 35 U.S.C. 154(b) by 145 days.

(21) Appl. No.: 10/250,329

(22) PCT Filed: Jul. 1, 2002

(86) PCT No.: PCT/JP02/06639

§ 371 (c)(1),
(2), (4) Date: Jun. 30, 2003

(87) PCT Pub. No.: WO03/002629

PCT Pub. Date: Jan. 9, 2003

(65) Prior Publication Data

US 2004/0063883 A1    Apr. 1, 2004

(30) Foreign Application Priority Data

Jun. 29, 2001   (JP) .............................. 2001-198978

(51) Int. Cl.
*B05D 3/02* (2006.01)
*C23C 4/04* (2006.01)

(52) U.S. Cl. ............ 427/387; 427/255.14; 427/255.18; 427/255.6; 427/384; 427/447; 427/452; 428/447; 428/901; 428/938

(58) Field of Classification Search ........... 427/255.14, 427/255.18, 255.6, 384, 387, 447, 452; 428/447, 428/901, 938
See application file for complete search history.

(56) References Cited

U.S. PATENT DOCUMENTS 5,217,568 A * 6/1993 Tessier et al. ................. 216/99

(Continued)

FOREIGN PATENT DOCUMENTS

GB       2 343 453 A       5/2000

(Continued)

OTHER PUBLICATIONS

T.M. Stokich, Jr., et al., "Real-Time FT-IR Studies of the Reaction Kinetics for the Polymerization of Divinyl Siloxane Bis-Benzocyclobutene Monomers", *Material Research Symposium Proceedings*, vol. 227, 1991, pp. 103-114.

*Primary Examiner*—Helen L. Pezzuto
(74) *Attorney, Agent, or Firm*—Sughrue Mion, PLLC

(57) ABSTRACT

This invention provides a process for producing an organic polymer film whereby when using it as an interlayer insulating film in a semiconductor device, the film exhibits higher adhesiveness at its interfaces where other semiconductor materials are in contact with the lower and the upper surface of the film while an effective dielectric constant in the whole organic polymer film can be further reduced. Specifically, a plurality of organic monomers vaporized is sprayed onto a heated substrate surface via plasma generated in a reaction chamber to form a copolymer film comprising frame composed of a plurality of organic monomer units. During the process, relative ratio between the feeding rate of the organic monomer molecules is varied along the progress of the film growth to continuously grow an interlayer insulating film in which films having good mechanical strength and adhesiveness with rich content of siloxane-structure are set near the interfaces (91a,c, 92a,c or 93a,c) and a film having a lower bulk density are arranged as an intermediate layer (91b, 92b or 93b) sandwiched therebetween.

11 Claims, 6 Drawing Sheets

U.S. PATENT DOCUMENTS

| | | | |
|---|---|---|---|
| 6,362,115 B1 * | 3/2002 | Mandal | 438/780 |
| 6,482,531 B1 * | 11/2002 | Timmons et al. | 428/500 |
| 6,696,225 B1 * | 2/2004 | Kanbe et al. | 430/320 |
| 6,784,118 B1 * | 8/2004 | Hayashi et al. | 438/779 |

FOREIGN PATENT DOCUMENTS

| | | | |
|---|---|---|---|
| JP | 11-17006 A | | 1/1999 |
| JP | 11-172418 A | | 6/1999 |
| JP | 2000-12532 A | | 1/2000 |
| JP | 2000-21868 A | | 1/2000 |
| JP | 10-289902 A | | 10/1998 |
| JP | 11-017006 | * | 1/1999 |

* cited by examiner

PRODUCTION METHOD FOR COPOLYMER FILM, COPOLYMER FILM PRODUCED BY THE FORMING METHOD AND SEMICONDUCTOR DEVICE USING COPOLYMER FILM

TECHNICAL FIELD

This invention relates to a process for forming a copolymer film that is usable as an insulating film constituting a semiconductor device, a copolymer film formed by the forming process and a semiconductor device utilizing the copolymer film. In particular, this invention relates to a process for vapor-phase growth of a copolymer film by using two or more starting monomers as starting materials thereof where they are fed in vapor phase to be copolymerized on a surface; and a semiconductor device in which the copolymer film formed by such a vapor-phase growth process is used as an insulating film for insulation between interconnections within a semiconductor device or between those connecting a plurality of semiconductor devices.

BACKGROUND ART

According as a size rule has been continuously reduced in semiconductor integrated circuit design, a space between adjacent interconnections has been narrowed. Consequently, delay due to parasitic capacitance between interconnections has been relatively increased and visible deterioration in high-speed performance resulting from the delay has been revealed. Specifically, in a semiconductor integrated circuit, its signal delay in propagation through interconnection depends on a CR time constant of the interconnection (C: interconnection capacitance; R: interconnection resistance). Thus, there is concern that when reduced line-width of interconnection cause increase in an interconnection resistance and in addition, decreased line-space between interconnections cause increase in a capacitance between the interconnections, which lead to significant increase in a CR time constant of interconnection, a rate for signal transfer in interconnections may become insufficient for an increasing switching speed in a transistor composing a circuit. Conventionally, an aluminum alloy has been generally used as an interconnection material in a semiconductor integrated circuit. However, a further integrated circuit for higher-speed operation requires an interconnection material with a reduced resistance for avoiding increase in an interconnection resistance due to reduction in a line-width of interconnection. Therefore, a copper-base interconnection has been recently used.

On the other hand, for avoiding increase in a capacitance between interconnections, there has been investigated applicability of insulating film materials with a lower dielectric constant than a silica ($SiO_2$) based insulating film which has been widely used as an insulating film between interconnections. As material with a lower dielectric constant which can be used as an insulating film between interconnections in a semiconductor device, applications of fluorinated silica (SiOF) and porous silica and further of organic polymer films (organic insulating films) have been made.

For example, a fluorinated silica has been already used in some of products having come into the market. However, increase in a fluorine content aiming at further reducing a dielectric constant of a fluorinated silica film itself may lead to such a further problem that hydrogen fluoride produced as a reaction product with water or hydrogen will give rise to erosion of an interconnection metal, or removal of fluorine atoms will result in increase in a dielectric constant. In addition, further progress in semiconductor integrated circuit technique requires much more reduction in dielectric constant of an interconnection insulating film so that a dielectric constant of about 3.3 achieved with a fluorinated silica (SiOF) film has not been sufficient any longer. Thus, the use of an insulating material with a very low dielectric constant of 3 or less has been paid attention. In this respect, porous silica is one of promising materials as it can give a dielectric constant of 2 or less, but on account of its structure, water condensation in micro-pores thereof may cause increase in its dielectric constant or lowering in a threshold bias for leakage. As it possesses lower mechanical strength owing to porous structure, there are considerable occasions of such a problem that it cannot bear up against a physical stress suffered at the steps of chemical mechanical polishing (CMP) or wire bonding.

It is thus highly demanded to develop an organic polymer film exhibiting excellent heat resistance and moisture resistance that are required in applying it to an interlayer insulating film that insulates multi-layered interconnections on a semiconductor integrated circuit from each other. It is essential for good moisture resistance in an organic polymer film that organic monomers used as composing units for the organic polymer have no hydrophilic groups. Furthermore, it is suggested to be desirable that when the organic polymer film is formed by the polymerizing reaction of organic monomers for its backbone, the process of polymerizing reaction are conducted with no step going through condensation reaction by dehydration which produces water. The term an "organic monomer" as used herein refers to a starting material used as a unit component for giving a desired organic macromolecule (organic polymer) through polymerization.

Examples of a conventional method for layering a functional organic polymer film such as an interlayer insulating film include spin-coating method where starting organic monomers are spin-coated and then polymerized in the coat layer to give a polymer film. The Spin-coating method is one of methods widely used for forming an organic polymer film. In this process, as the organic monomers are dissolved in a solvent for spin coating, at a layer-forming step following the step of forming a coat layer, the solvent contained therein is removed by evaporation while the remaining organic monomers are heated up to make progress in polymerization of the monomers with each other. Finally, the polymerization gives, for example, a film having two- or three-dimensional network structure or polymer film being composed of the organic monomers as component units. The organic polymer thus obtained is an insulating material and thus functions as an organic insulating film. The composition and the structure of the organic insulating film formed by the spin coating process depend on the structures of the organic monomers dissolved in the organic solvent used in spin coating and a content ratio of a plurality of organic monomers therein. Accordingly, in principle, it is impossible to make changes in a composition of an organic insulating film in its thickness direction.

In "REAL-TIME FT-IR STUDIES OF THE REACTION KINETICS FOR THE POLYMERIZATION OF DIVINYL SILOXANE BIS BENZOCYCLOBUTENE MONOMERS" (Material Research Symposium Proceedings Vol. 227, p. 103, 1991) T. M. Stokich Jr., W. M. Lee, R. A. Peters (hereinafter referred to as Reference 1), for example, there is a description about a process for forming a film made of an organic polymer having a three-dimensional molecular chain structure that is composed of divinylsiloxane bis (benzocyclobutene) monomer as frame units, as represented by chemical formula (IV) below; the process comprises the steps of spin-coating a solution of divinylsiloxane bis(benzocyclobutene) monomer in mesitylene as a solvent, pre-baking the coat layer at 100° C. to remove the solvent, mesitylene, thereof, and then heating up to 300° C. to 350° C. to initiate thermal ring-opening polymerization of the four-membered carbocyclic ring in the benzocyclobutene skeleton of the starting monomer molecule; Formula (IV): polymer film being composed of a divinylsiloxane bis (benzocyclobutene) as a frame unit additional cost for production, which thus may be one of hurdles making cost reduction difficult.

Furthermore, it is predicted that oxygen dissolved in an organic solvent used may optionally react organic monomers during baking. For eliminating such possibility, the atmosphere during process comprising the steps of preparation of the solution and spin coating needs be strictly regulated. When using the spin coating method, it is difficult to strictly control the atmosphere throughout all the whole process. Furthermore, an organic solvent is used in spin coating of organic monomers as well as in coating of resist.

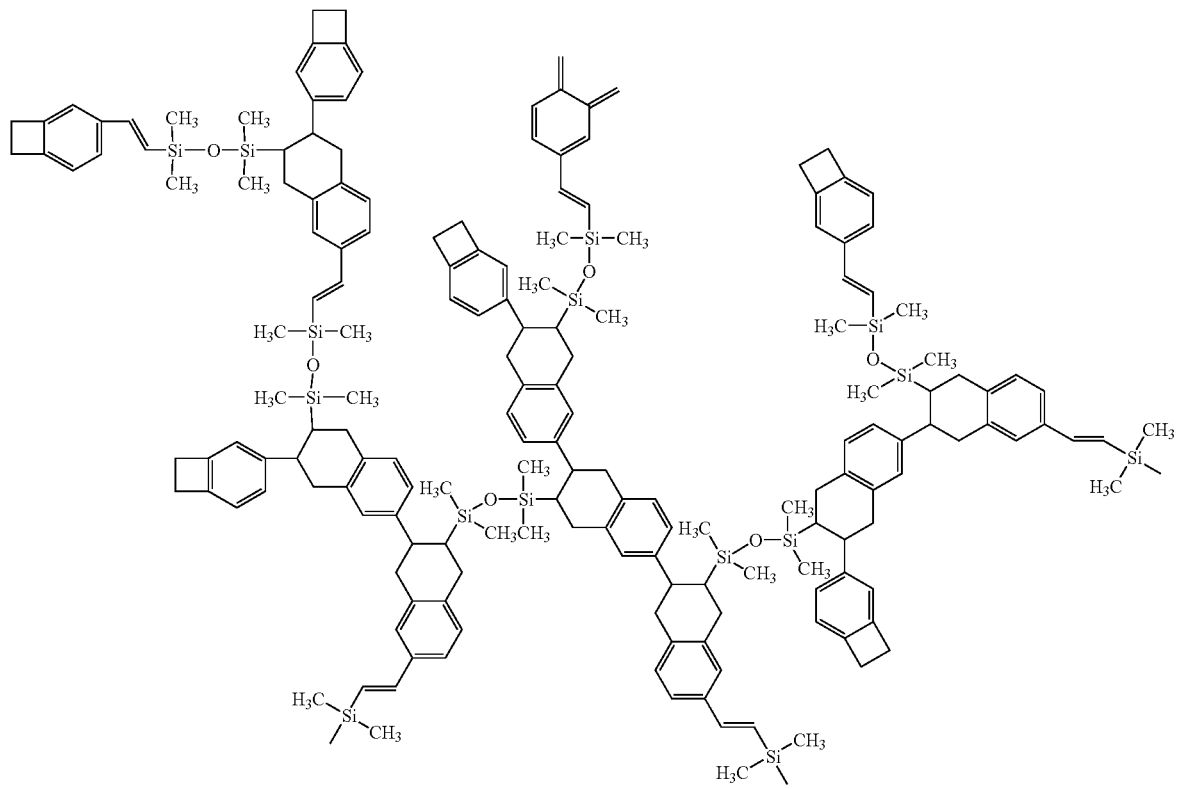

In the spin coating method, organic monomers are dissolved in an organic solvent, and then the resulted solution is spin-coated so that about 90% of the solution used at the spin coating step is flown out of a substrate. Thus, with respect to organic monomers used as its starting material, it is a method having a poor utilization efficiency thereof. As a result, the organic monomers used as its starting material have a relatively higher proportion in a production cost.

During the spin-coated film is heated in a baking furnace to evaporate the organic solvent and the coat is further heated at a higher temperature to form a desired organic polymer film by initiating polymerization of the organic monomers therein, if oxygen is present in the baking furnace, the oxygen molecule may react with a part of the organic monomers, which gives rise to an occasional failure in production of the desired organic polymer film. For preventing such a side reaction, the atmosphere of the whole system must be replaced with an inert gas such as nitrogen for eliminating oxygen molecules remaining in the baking furnace in advance. This treatment is a factor leading to an Thus, although the process is carried out in a spin-coating chamber with local exhaust under a clean atmosphere, floating fine dust particles or fine particles of organic monomers dried to solid after scattering may happen to contaminate a spin-coated film formed. For a resist, such contaminants can be finally removed at the end of a series of steps, and therefore, if contaminating of fine particles occurs, they do not remain in a semiconductor device obtained. On the other hand, in the case of an organic polymer film in use for such an interlayer insulating film, the organic polymer formed has an abnormal microscopic structure around the fine particles, which may be an occasion for deterioration in quality of the organic insulating film, for example, local leak channels may be generated thereby after long-term operation, which will affect its high performance in protecting against leakage. Of course, in the case of spin coating, as large amount of a volatile solvent is used therein, the handling is carried out under a circumstance with local exhaust, which strives to draw back the organic solvent vaporized, but there is not few occasions that a very small amount thereof may get off, and thus spin coating method has an inherent problem such that it may load environment with a significant burden.

We have proposed a process by means of organic-monomer evaporation as for a process for forming a functional film of a organic polymer by utilizing a vapor growth method in Japanese Patent Application Laid-open No. JP 11-017006A. According to this method for vapor growth of an organic polymer film, it is a process comprising the steps of evaporating an organic monomer as a starting material, feeding the monomer molecule in vapor phase, and then thermally polymerizing the monomer molecules with each other on a substrate to obtain a film of an organic polymer thereby. FIG. 6 schematically shows an apparatus for film formation according to such a method for vapor growth of an organic polymer film using the vapor of an organic monomer directly vaporized as a starting material. An organic monomer 1 in a reservoir 55 is heated under a reduced pressure to vaporize. On the other hand, while a reaction chamber 51 is held under a reduced pressure by evacuating with a vacuum pump 50, the vaporized molecule of the organic monomer is fed into the reaction chamber 51 via a gasified material line 56. The molecules of organic monomer supplied adhere to the surface of a semiconductor substrate 53 where a semiconductor integrated circuit is formed in advance. At that time, the semiconductor substrate 53 is heated with a substrate heater 54 so that progress in polymerization reaction between the organic monomer molecules is made by a thermal energy at the temperature, and a cross-linked structure is built up therewith to form an organic insulating film 52. In the process for layered growth of an organic polymer film described deposition in Japanese Patent Application Laid-open No. JP 11-017006A, which is referred herein as to an organic monomer evaporation method, in contrast with the spin-coating method, no organic solvent is used in the process, and further as the layer growth is conducted in a reaction chamber with a reduced pressure, oxygen is not present in the atmosphere therein. Therefore, the method has an advantage that in principle it eliminates factors adversely affecting a quality of film, such as reaction with oxygen molecules and bubbles or voids associated with vaporization of an organic solvent remaining in a coat film, which are sometimes observed in the spin-coating method. However, there remains a technical problem that, when a substrate temperature is elevated for increasing a polymerization degree or increasing a polymerization rate, it heightens rate of desorption of organic monomer molecules once adsorbed, resulting in lowering an effective rate of adsorption onto a substrate, and as a result, aimed improvement in a growth rate cannot be achieved.

DISCLOSURE OF THE INVENTION

In Japanese Patent Application Laid-open No. JP 2000-12532 (hereinafter, referred to as "Reference 2"), the present inventors have proposed a MVP (Monomer-vapor Polymerization) method as for a process for layer-growth of a functional film of organic polymer, which is a further improvement on the aforementioned organic monomer evaporation method. According to this method, with aim of increase in reaction rate of polymerization, the process comprises the steps of directly vaporizing an organic monomer being used as a backbone of a polymer film, feeding the vapor of organic monomer by using a carrier gas, and spraying the vapor on a surface of substrate heated up through plasma, such as He plasma, generated in the reaction chamber with a reduced pressure to form a film of organic polymer on a surface of substrate. Specifically, when passing through said plasma atmosphere such as He plasma, the starting organic monomer molecules are excited thereby so that the molecules converted into the state having increased reactivity reach the substrate surface. The organic monomer molecules excited in advance are readily polymerized by adding with a relatively smaller thermal energy. Therefore, it has a merit that an aimed improvement of polymerization rate may be achieved even if a relatively lower substrate temperature is chosen.

In contrast, according to a conventional CVD method, for example, when TEOS (tetraethyl orthosilicate: $Si(OCH_2CH_3)_4$) as a liquid organo-silica source is vaporized and a silicon oxide film is deposited in an evacuated reaction chamber by using the vapor as a starting material, its chemical reaction in vapor phase with ozone or oxygen supplied via another path of line is carried out in the reaction chamber to form a film of $SiO_2$ on a substrate surface. In other words, loss of the chemical structure of the starting material (TEOS) results from the reaction, and thus deposited is a film ($SiO_2$) with a different structure that does not retain any chemical moieties in the starting molecule at all. On the other hand, according to the MVP method as disclosed in Ref. 2, as a organic monomer being transported in vapor phase bring about reaction of polymerization by itself on a substrate, a film formed on the substrate is a film containing the structure of the starting organic monomer as its skeletal structure. Furthermore, the method takes such significant effect that its film thickness can be precisely adjusted with high reproductivity only by controlling the amount of the organic monomer to be supplied. For distinguishing from the conventional CVD method, the method described in Japanese Patent Application Laid-open No. JP 2000-012532A, in which polymerization is enhanced by using plasma for depositing a film of an organic polymer, is particularly referred to as a "plasma polymerization method". For instance, has provided a film of organic polymer obtained by this plasma polymerization method has attained such a low dielectric constant of 2.5 to 2.7 by using divinylsiloxane bis(benzocyclobutene) (DVS-BCB) monomer as a staring organic monomer, but it is hard for a plasma polymerization film being obtainable by using the DVS-BCB monomer to achieve a further lower dielectric constant. Specifically, it is effective for achieving a further lower dielectric constant to reduce a bulk density of a film of organic polymer produced, but it is difficult for a plasma polymerization film being obtainable by using the DVS-BCB monomer to further lower a bulk density thereof. Thus, it is necessary to further introduce organic skeleton having a sterically hindered group into a film of organic polymer.

For using such an organic polymer film as an interlayer insulating film, it is of course necessary that when reducing a dielectric constant of the polymer film itself, high adherence of the organic polymer film to other adjacent semiconductor materials is maintained. Furthermore, although an organic polymer film inherently has a low dielectric constant, it is also effective, in addition to reduction in a bulk density, to reduce a content of polar elements such as oxygen and silicon contained in the polymer as much as possible for achieving a further lowering a dielectric constant thereof. On the other hand, these polar elements substantially contribute to adhesion of the organic polymer film to the other semiconductor materials or metals. Accordingly, lessening a bulk density and also reducing a ratio of polar elements contained such as oxygen or silicon for achieving a lower dielectric constant may lead to reduction of a surface density of the polar elements present in an interface between the organic polymer film and the other semiconductor materials, so that it is hard to maintain high adhesiveness thereof.

Specifically, in a plasma polymerization film formed using a single monomer material, a polymer structure thereof may be varied to some extent by changing deposition conditions used therein, such as a plasma and a substrate temperature, but the controllable extent thereby is of course limited. Therefore, the controllable extent of film property obtained thereby is not enough wide to attain a continued and wide modification of film property in a thickness direction of the film of polymer made by using single monomer material such that the structure having a high surface density of the polar elements is formed to give high adhesiveness in an interface with a base substrate surface; after the step of coating for the interface region, a polymer with a lower bulk density is formed for reducing a density of the polar elements contained in a unit volume; and after then the structure having a high surface density of the polar elements is formed again for the top surface region adhering with other semiconductor materials. That is, in conventional plasma polymer film formed using a single monomer material, it is impossible to have such a continued and wide control over the film property in a thickness direction of the film formed as to satisfy the required level described above.

For solving the problems set forth, an object of this invention is to provide a process for producing an organic polymer film whereby when using the organic polymer film as an interlayer insulating film in the aforementioned semiconductor device, the organic polymer film exhibits higher adhesiveness at its interfaces where other semiconductor materials are in contact with the lower and the upper surface of the film while an effective dielectric constant in the whole organic polymer film can be further reduced. More specifically, the object of this invention is to provide a process for forming a copolymer film having frame composed of a plurality of organic monomer units, which has good control for making a microscopic structure of the polymer vary in a continuous and wide range along the thickness direction of the film formed by the deposition method wherein the principle of the MVP method, in particular of the plasma polymerization method is applied with use of a plurality of organic monomers as starting materials. In addition, a final object of this invention is to provide a copolymer film with its microscopic structure continuously and extensively varying in its thickness direction, which can be prepared only by employing said process for forming an organic polymer film, and also a semiconductor device using such a copolymer film as an interlayer insulating film.

We have intensely studied and examined with an attempt to solve the problems described above, and consequently we have found that when forming an organic polymer film by applying the principle of a vapor phase deposition method, for example, of the aforementioned MVP method, in particular, that of plasma polymerization, use of a plurality of starting organic monomers as starting materials used therein allows formation of a film of a copolymer composed of the plurality of organic monomers being copolymerized together, and further that in the process, a ratio of framing units derived from each of the organic monomers compose the obtainable copolymer is controllable by regulating a relative ratio for the plurality of organic monomers fed as starting materials thereof. In addition to these findings, we have also verified that as said process can produce a copolymer film with a microscopic structure varying continuously and extensively in its thickness direction, when utilizing the organic polymer film as an interlayer insulating film comprised in the semiconductor device mentioned above, use of said technique can form the organic polymer film which exhibits high adhesiveness at its interfaces with other semiconductor materials being in contact with the lower and the upper surfaces of the film while an effective dielectric constant in the whole organic polymer film can be further reduced. As the result, we have achieved this invention.

Thus, a process for preparing a film of copolymer according to this invention is a process for forming a film of copolymer by means of vapor phase deposition method, wherein the film of copolymer comprises a copolymer being framed at least with two organic monomer units or more;

each of said at least two or more organic monomers is polymerizable in presence of the organic monomer alone and also polymerizable together at least with the another organic monomer thereof; and the process comprises at least the steps of:

feeding a gas mixture containing vapors of said at least two or more organic monomers as staring materials into an reaction chamber under a reduced pressure;

spraying said fed gas mixture onto a surface of a base being heated up which is placed in said reaction chamber;

polymerizing the at least two or more organic monomer molecules contained in the gas mixture sprayed to form the film of copolymer on said surface of the base being heated up. The process defined above may be the process for forming a film of copolymer, further comprising, in the reaction chamber under the reduced pressure, the step of passing said gas mixture through a plasma generated, between said step of feeding the gas mixture into the reaction chamber under the reduced pressure and said step of spraying the same onto the surface of the base heated.

Furthermore, it is preferred that the process for preparing a film of copolymer according to this invention may be reduced to practice through the process for forming a copolymer film, wherein during said step of feeding the gas mixture into the reaction chamber under the reduced pressure, with respect to at least two or more organic monomers being contained in said gas mixture, the relative ratio between the contents of the organic monomer molecules is varied along the progress of the film growth to modify an average in-plane composition that is represented by contents of the framing units derived from said at least two or more organic monomers, of which the relative ratio contained are changed, at least in the thickness direction of the film of copolymer formed thereby.

In the processes for preparing a film of copolymer according to this invention, which have the constitutions mentioned above, an example of them may be the process for forming a copolymer film, wherein at least two of said two or more organic monomers used as starting materials thereof are divinylsiloxane bis(benzocyclobutene) monomer represented by formula (I):

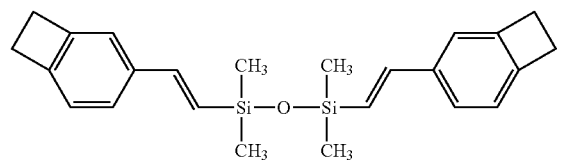

(I) divinylsiloxane bis(benzocyclobutene) and bis(benzobutenyl)butadiene monomer represented by formula (II):

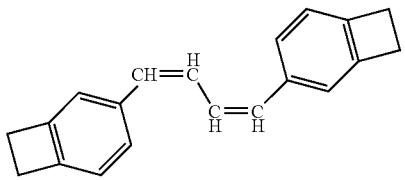

(II) bis(benzobutenyl)butadiene. Further, another example of them may be the process for forming a copolymer film, wherein at least two of said two or more organic monomers used as starting materials thereof are divinylsiloxane bis(benzocyclobutene) monomer represented by formula (I):

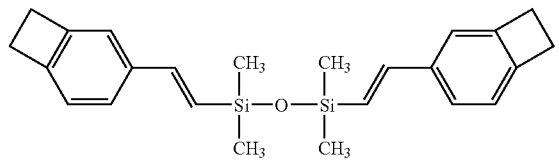

(I) divinylsiloxane bis(benzocyclobutene) and bis(benzobutenyl)butadiene derivative monomer represented by general formula (III):

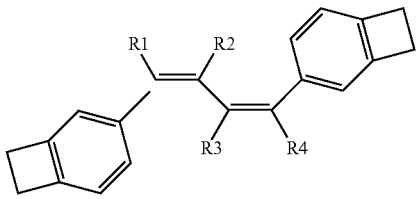

(III) bis(benzobutenyl)butadiene derivative
where R1, R2, R3 and R4 independently represent hydrogen or unsaturated hydrocarbon group.

Furthermore, another example of them may be the process for forming a copolymer film, wherein at least one organic monomer of said two or more organic monomers used as starting materials thereof has a structure of an openable ring and an addition-polymerizable structure of ethen-1,2-diyl (—CH=CH—) in its molecule.

Alternatively, another example of them may be the process for forming a copolymer film, wherein at least one organic monomer of said two or more organic monomers used as starting materials thereof is one containing a silicon atom in the molecule, while at least another organic monomer is one containing no silicon atom within the molecule. Similarly, another example of them may be the process for forming a copolymer film, wherein at least one organic monomer of the at least two or more organic monomers used as starting materials thereof contain a structure of siloxane bond (Si—O) in the molecule.

On the other hand, it may be reduced to practice through the process for forming a copolymer film, wherein at the early stage for initiating the vapor phase deposition of the copolymer film, among said at least two or more organic monomers used as starting materials thereof, high ratio of said feeding is set for at least one or more organic monomers containing a silicon atom in the molecules, and then a latter stage is set to lower said high ratio of feeding for the organic monomers. In a similar way, it may be reduced to practice through the process for forming a copolymer film, wherein at the early stage for initiating the vapor phase deposition of the copolymer film, among said at least two or more organic monomers used as starting materials thereof, high ratio of said feeding is set for at least one or more organic monomers containing a structure of siloxane bond (Si—O) in the molecules, and then a latter stage is set to lower said high ratio of feeding for the organic monomers.

In addition, this invention provides a copolymer which can be formed only by using the aforementioned process for forming a copolymer film:

That is, a film of copolymer according to this invention is a film of copolymer formed on a surface of a base by means of vapor phase deposition method, comprising a copolymer formed by copolymerization of at least two or more organic monomers, wherein the copolymer has structures retaining skeletons derived from said at least two or more organic monomers; and having a region where an average in-plane composition thereof that is represented as a ratio of the at least two or more organic monomer units composing said copolymer varies continuously in its film thickness direction.

An example of the copolymer films of this invention defined above may be the film of copolymer wherein at least one or more organic monomer units of the at least two or more organic monomer units composing said copolymer have a structure of siloxane bond (Si—O) as an internal structure thereof; and a density of the structure of siloxane bond (Si—O) contained in the film continuously varies in its thickness direction as the average in-plane composition represented by said ratio of the organic monomer units continuously varies. In the cases, an example thereof may be such an embodiment as the film of copolymer wherein the continued variation in the density of the structure of siloxane bond (Si—O) contained in the film that is present in its thickness is set such that the densities of the structure of siloxane bond (Si—O) structure in the regions near the lower surface of the copolymer film being in contact with the base surface and the upper surface of the film are both high, relative to that in its middle region of the thickness.

In the copolymer films having any type of constitutions defined above according to this invention, further example of them may be such an embodiment as the film of copolymer wherein an average in-plane bulk density of the copolymer in the regions near the lower surface of the copolymer film being in contact with the base surface and the upper surface of the film is high, relative to that in its middle region of the thickness.

Furthermore, when a copolymer film according to this invention is applied to a semiconductor device, the more specific embodiment of the film of copolymer according to this invention may be a film of copolymer formed on a surface of a base constituting the semiconductor device by vapor phase deposition method, comprising a copolymer formed by copolymerization of at least two or more organic monomers, wherein the copolymer has structures retaining skeletons derived from said at least two or more organic monomers; and wherein at least one organic monomer unit of the at least two or more organic monomer units composing said copolymer has a structure of siloxane bond (Si—O) as its internal structure;

the film has a layered structure in its thickness direction consisting of the upper, the intermediate and the lower layers which are distinguished from each other by difference in density of said structure of siloxane bond (Si—O) contained in the film;

said density of the structure of siloxane bond (Si—O) is low in the intermediate layer, relative to those in said upper and lower layers; and the film is shaped into such a form that a copper interconnection film in the semiconductor device is buried in the film of copolymer having the layered structure.

Alternatively, the copolymer film may be a film of copolymer formed on a surface of a base constituting the semiconductor device by vapor phase deposition method, comprising a copolymer formed by copolymerization of at least two or more organic monomers, wherein the copolymer has structures retaining skeletons derived from said at least two or more organic monomers; and wherein at least one organic monomer unit of the at least two or more organic monomer units composing said copolymer has a structure of siloxane bond (Si—O) as its internal structure;

the film has a layered structure in its thickness direction consisting of the upper, the intermediate and the lower layers which are distinguished from each other by difference in density of said structure of siloxane bond (Si—O) contained in the film;

said density of the structure of siloxane bond (Si—O) is low in the intermediate layer, relative to those in said upper and lower layers; and the film is shaped into such a form that a via copper film in said semiconductor device is buried in the lower layer of the film of copolymer having the layer structure and a copper interconnection film is buried in the intermediate and the upper layers thereof.

In association with them, provided is the invention of an apparatus for forming the film of copolymer of this invention. That is, it is an apparatus for forming a film of copolymer by vapor phase deposition method, wherein the film of copolymer comprises at least a copolymer having skeletons composed of two or more organic monomer units;

the apparatus comprises systems for the vaporization of organic monomer independently equipped for said at least two or more organic monomers;

systems for independently feeding the gases of organic monomers generated in the organic monomer vaporization systems into a reaction chamber together with a carrier gas thereof;

a system for mixing said at least two or more organic monomers independently fed by a shower head equipped in the reaction chamber;

a system for generating plasma under the shower head in said reaction chamber, to which a high frequency power source thereof are connected;

a system for heating a wafer being placed underneath the plasma; and wherein the gas mixture of said at least two or more organic monomers mixed by said shower head is sprayed onto a surface of a base that is the surface of the wafer being heated by said heating system, and thereby the at least two or more organic monomer molecules contained in the gas mixture being sprayed are polymerized to form the film of copolymer.

Finally, this invention will provide also an invention of a semiconductor device using the aforementioned film of copolymer according to this invention. That is, the semiconductor device provided in this invention is a semiconductor device using one or more organic polymer films as an interlayer insulating film, wherein at least one of the organic polymer films provided as said interlayer insulating film therein is a film of copolymer according to this invention, which has any of the constitutions described above.

Figure 1:
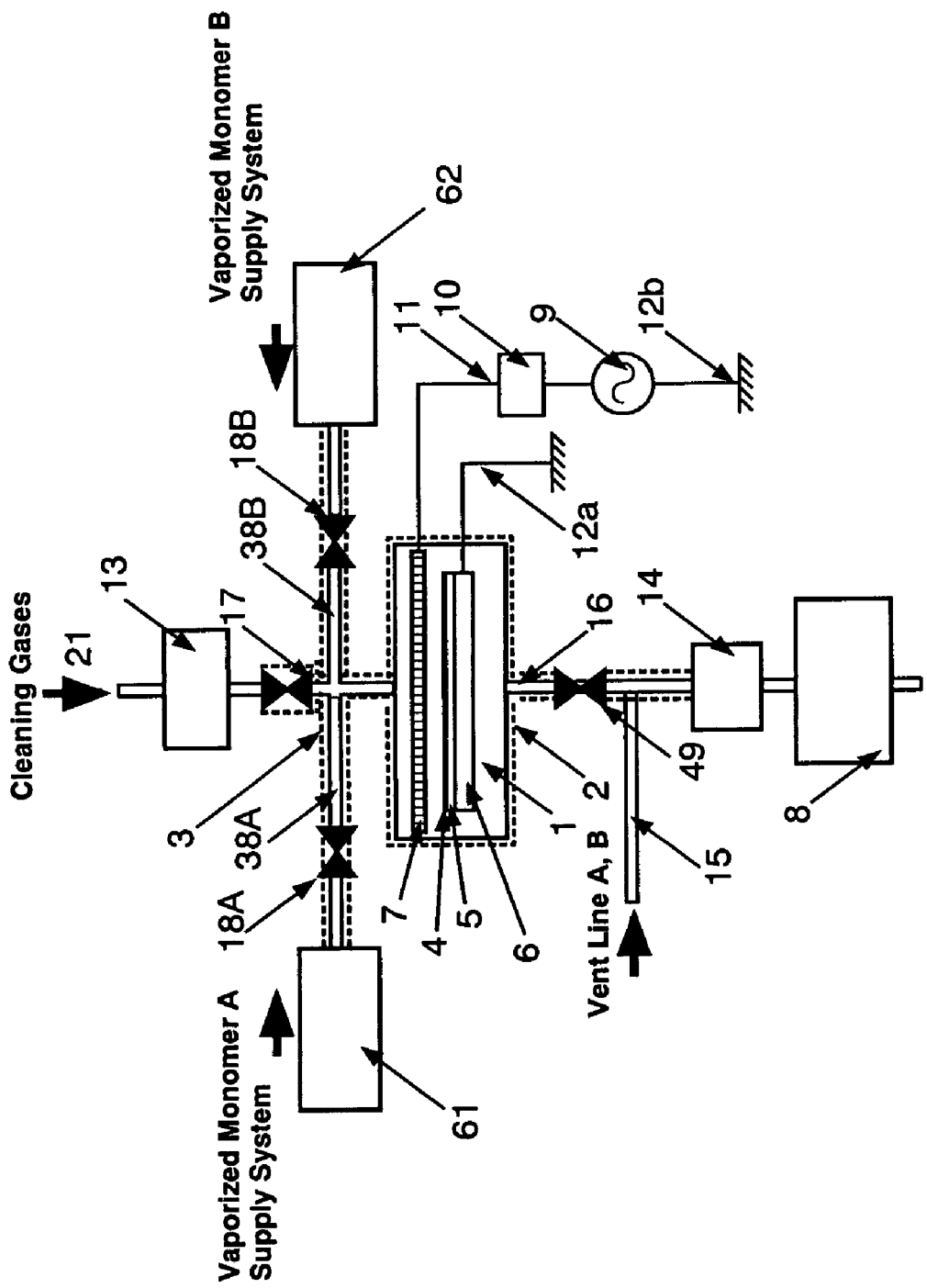
FIG. 1 schematically illustrates an example of apparatus setups for forming a film of polymer, which are usable for conducting a process for preparing a film of copolymer according to this invention.
Figure 2:
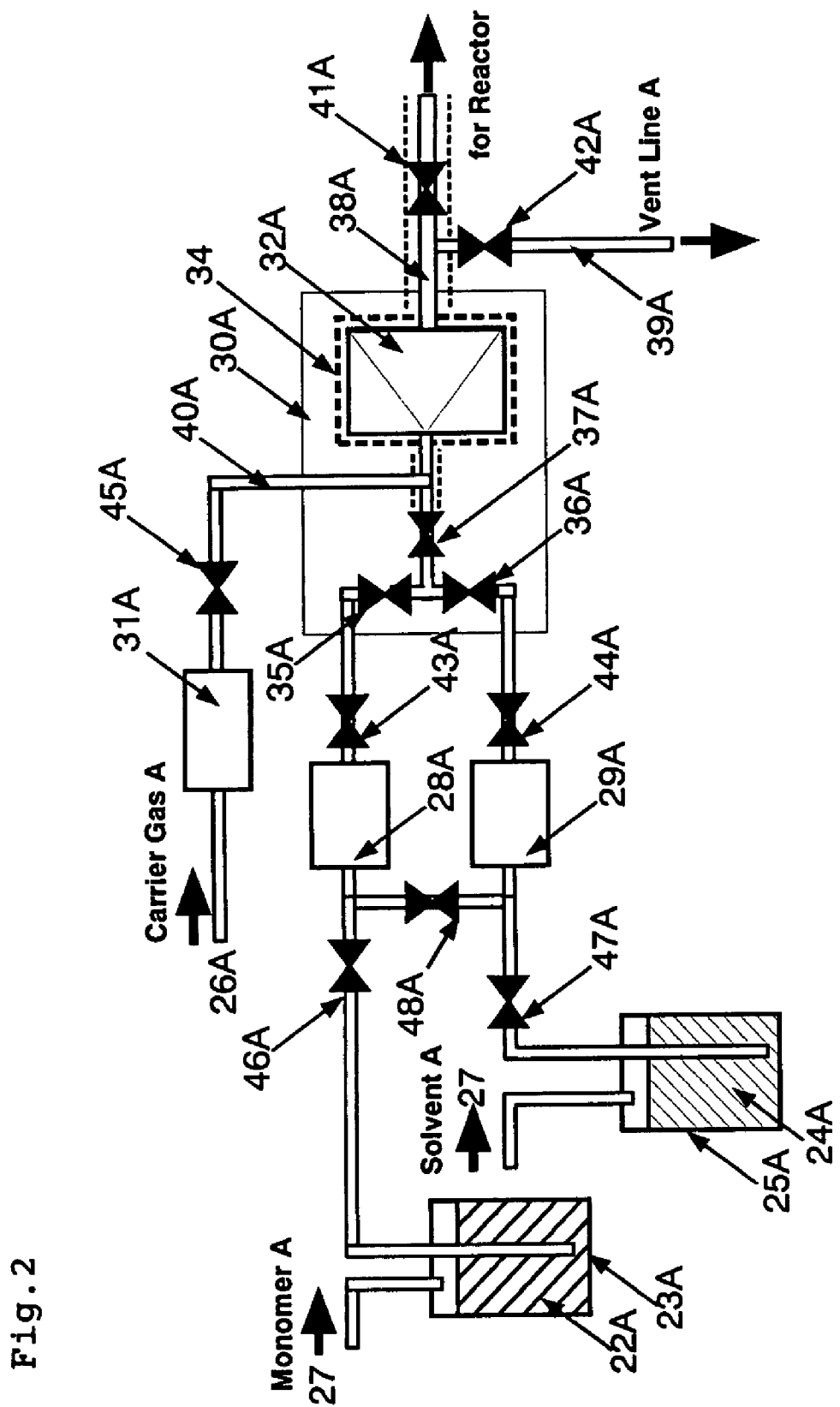
FIG. 2 schematically shows an example of constitutions of vaporization controllers, which are applicable for supply and vaporization of a liquid organic monomer used in a process for forming a film of copolymer according to this invention.
Figure 3:
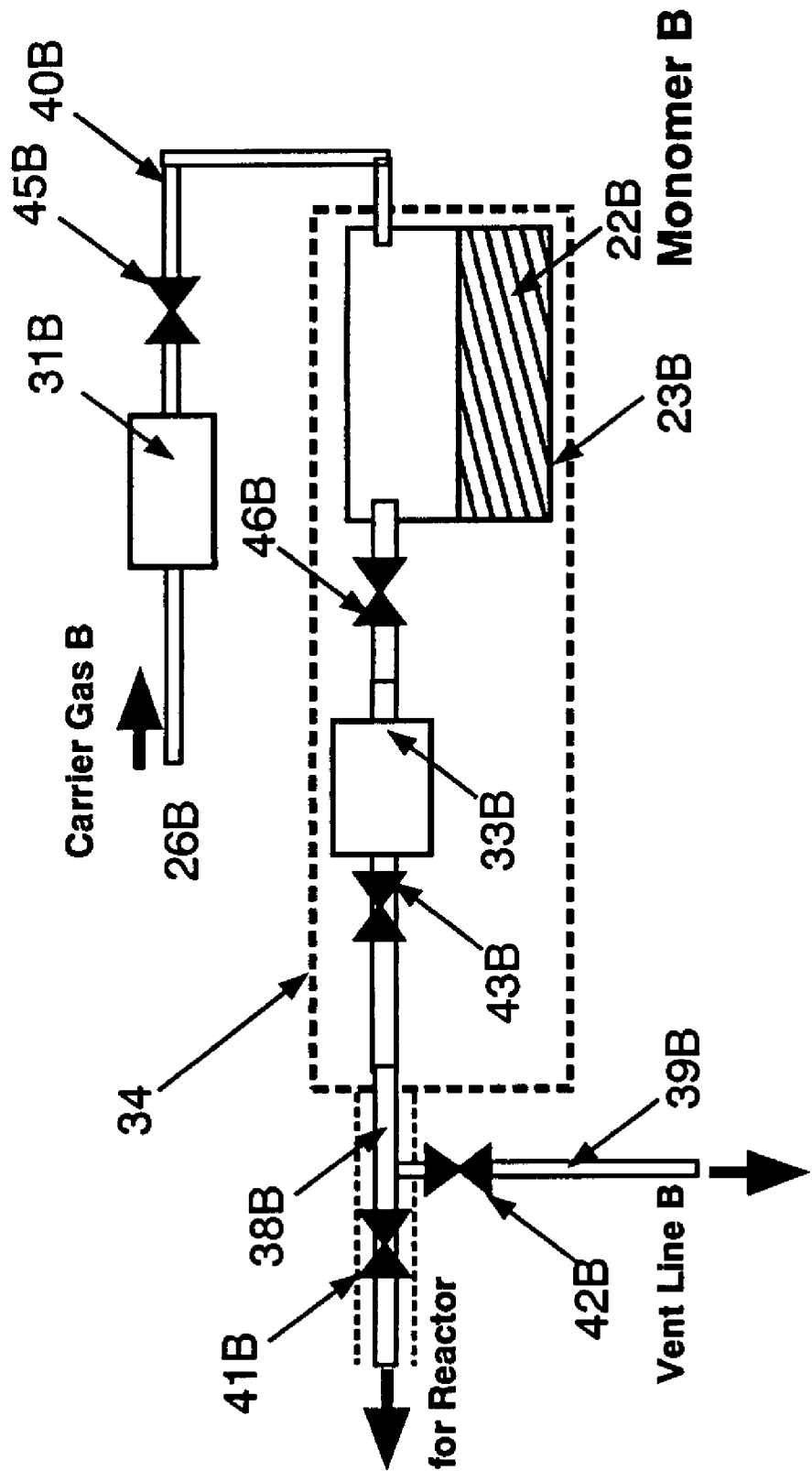
FIG. 3 schematically shows an example of constitutions of vaporization controllers, which are applicable for supply and vaporization of a solid organic monomer used in a process for forming a film of copolymer according to this invention.

Various components being comprised in the apparatuses shown in FIGS. 1 to 3 denote the followings:

1: reaction chamber, 2: reaction chamber heater,
3: line heater, 4: copolymer film,
5: semiconductor substrate, 6: substrate heating unit,
7: shower head, 8: vacuum pump,
9: RF power, 10: matching box,
11: RF cable, 12a, 12b: ground wires,
14: cooling trap, 15: waste line,
16: evacuation line, 17: valve, 18A, 18B: valves,
19A: vaporized monomer A, 19B: vaporized monomer B,
20A: evacuated vaporized. monomer A,
20B: evacuated vaporized monomer B,
13: gas flow controller, 21: cleaning gas,
22A: organic monomer A, 22B: organic monomer B,
23A: organic monomer A tank, 23B: organic monomer B tank,
24A: cleaning solvent A, 25A: cleaning solvent A tank,
26A: carrier gas A, 26B: carrier gas B,
27: pressure delivery gas,
28A: liquid flow indicator for organic monomer A,
29A: liquid flow indicator for cleaning solvent A,
30A: vaporization controller A, 32A: vaporization chamber,
34: heater, 31A: gas flow controller A,
35A: vaporization controlling valve A,
36A: cleaning solvent controlling valve A,
37A: valve in vaporization controller A,
38A: vaporized material A feeding line,
39A: vaporized material A evacuation line, 40A: carrier gas A supplying line,
31B: gas flow controller B, 33B: gas flow indicator B,
38B: vaporized material B feeding line,
39B: vaporized material B evacuation line,
40B: carrier gas B supplying line,
41A, 41B to 48A, 48B: valves,
61: vaporized monomer A feeding system;
62: vaporized monomer B feeding system.

Figure 5:
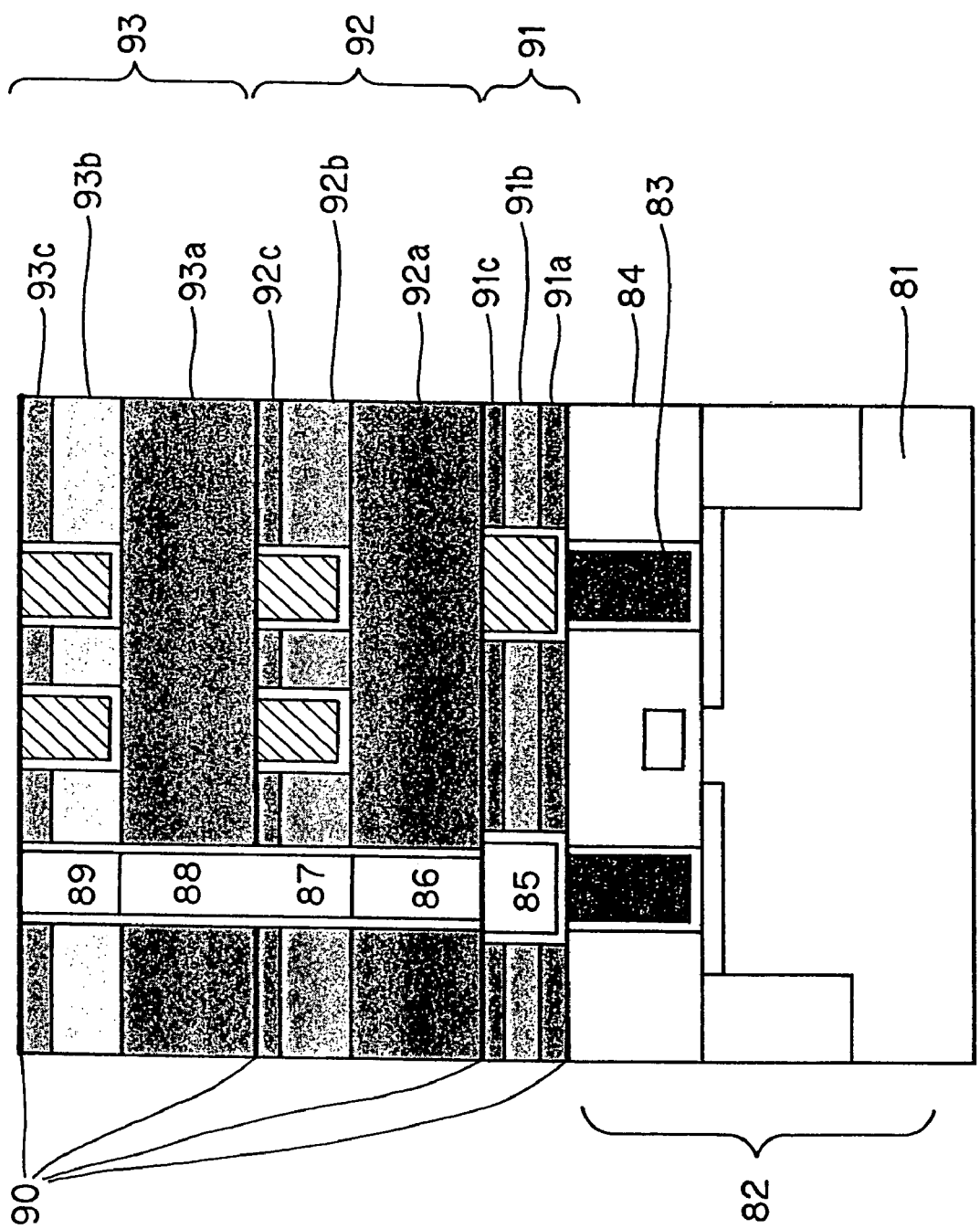
FIG. 5 is a section view schematically showing an example of the semiconductor devices using a film of copolymer according to this invention as an insulating film layer therein for interlayer insulation to realize a multi-layer copper interconnection.
Figure 6:
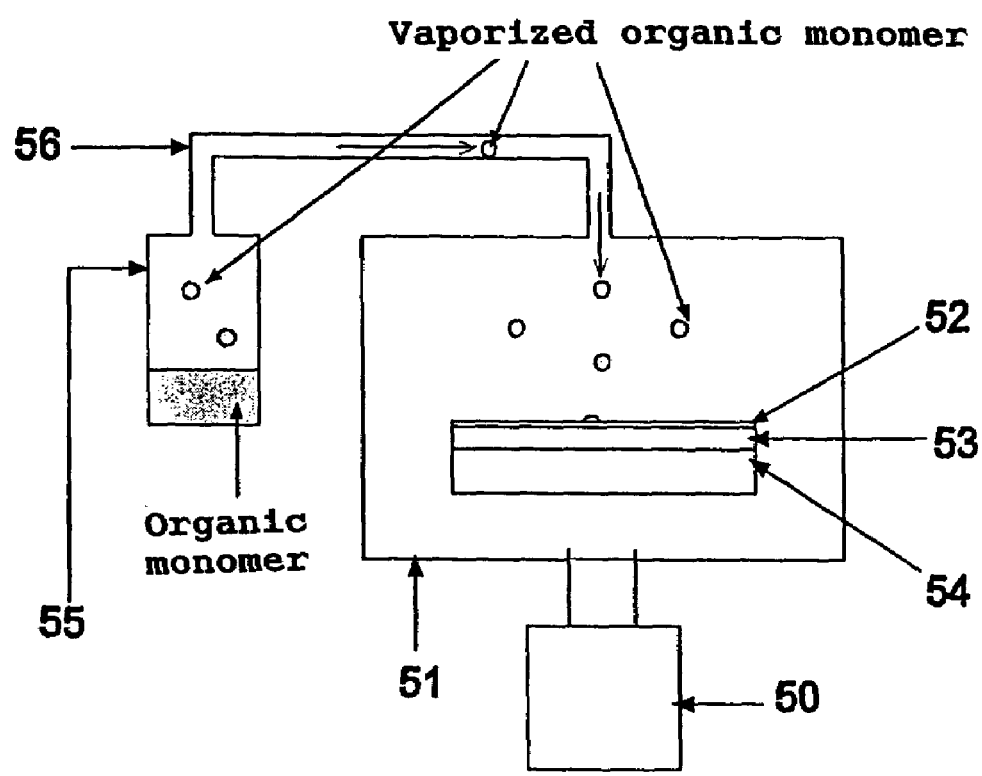
FIG. 6 illustrates the principle of MVP method employed in a process for forming a film of copolymer according to this invention.

In the section view shown in FIG. 5, various components denote the followings:
81: silicon substrate, 82: MOSFET,
83: copper contact plug,
84: inorganic interlayer insulating film,
85: first copper interconnection, 86: via,
87: second copper interconnection, 88: via,
89: third copper interconnection,
90: copper diffusion barrier film,
91: first interconnection insulating film,
91a, 91c: DVS-BCB films, 91b: DVS-BCB/BBB copolymer film,
92: second interconnection insulating film,
92a, 92c: DVS-BCB films, 92b: DVS-BCB/BBB copolymer film,
93: third interconnection insulating film,
93a, 93c: DVS-BCB films, 93b: BBB polymer film.

Best Mode for Carrying out the Invention

According to this invention, when an organic polymer film which can be used as an organic insulating film is formed by vapor phase deposition method that is a further improvement on such a technique as MVP method, in particular, the plasma polymerization method, of which principle has been explained above, use of a plurality of organic monomers as polymerizable materials therein allows introduction of a polymer structure comprising skeleton units derived from the plurality of monomers, and thus it leads to successful obtaining a film of organic polymer having extensive functionality, which can be never achieved by the prior art using a single starting monomer. Furthermore, during a step of film growth by vapor phase deposition method, supplied amounts of individual starting monomers that are fed as a gas mixture thereof are independently regulated so that in a film-thickness direction, the structure of the film of copolymer, specifically a content ratio (composition) of the skeleton-units derived from the starting monomers composing thereof, can be controlled in a wide range. Therefore, a copolymer film formed on an interface in contact with a semiconductor material including such as a silicon oxide film, for example, on a surface of a semiconductor material used as a base at the initiation of deposition, may have a structure (composition) where a ratio of organic monomer units significantly contributing to adhesion to the semiconductor material is set to be high, which will provide an improved adhesiveness in the interface. Similarly, at the end of deposition, the surface of the film of polymer may have a structure (composition) where a ratio of organic monomer units significantly contributing to adhesion to the semiconductor material formed thereon is set to be high, which will provide an improved adhesiveness in an interface with an upper semiconductor material layer that is formed by deposition on the film of copolymer as a base. On the other hand, the middle region of the film of copolymer may have a structure (composition) different from that in said bottom (lower layer) or top surface (upper layer) of the film where a ratio of organic monomer units that facilitates in structurally reducing a density thereof is increased, which allows lowering of an effective dielectric constant of the copolymer formed in the middle region. In comparison with the use of a single monomer, introduction of the organic monomer units that facilitates in structurally reducing a density thereof structurally reducing a density may result in reduction of a bulk density by, for example, 10% to 55%. It is, therefore, possible that an effective dielectric constant as the whole copolymer film is lowered thereby, while excellent adhesiveness to the semiconductor materials is maintained in the interfaces with semiconductor material used as the base and with the upper semiconductor material layer formed on the polymer film surface.

In this invention, starting organic monomers used for forming a film of copolymer are at least two or more organic monomers; each of the organic monomers is, of course, polymerizable with at least one another organic monomer to form a copolymer structure. Furthermore, it is one of characteristic feature of this invention that each organic monomer of the at least two or more organic monomers, when used alone, can be polymerized to give a homopolymer film composed of the skeleton of the organic monomer itself. For example, two organic monomers A and B may be copolymerized with each other, and also, when the organic monomer A or B is used alone, its polymerization may progress by itself. Therefore, even when a ratio between organic monomers A and B is considerably changed, a local structure caused by either of polymerization of organic monomer A itself or polymerization of organic monomer B, besides polymerization of organic monomers A and B, may be introduced to form a copolymer having a composition ratio reflecting a feeding ratio between organic monomers A and B.

This invention will be explained in detail.

An example of deposition apparatus that is usable for conducting the process of this invention will be described with reference to FIG. 1 schematically showing its outline. A reaction chamber 1 is evacuated by a vacuum pump 8 and a substrate heating unit 6 is equipped in the reaction chamber 1. A semiconductor substrate 5 as a base on which a copolymer film is to be formed is set on the substrate heating unit 6. Organic monomers A and B used as starting materials are vaporized in systems for vaporizing and feeding 61, 62, respectively. Each of the vapors together with a carrier gas is fed into the reaction chamber 1 through vaporized material feeding lines 38A, 38B and valves 18A, 18B, respectively. Until the vapors reach the reaction chamber 1, the walls of the vaporized material feeding lines 38A, 38B are heated up with an attached heater 3 to keep a temperature of the line walls at a temperature where partial pressures of organic monomers A and B passing through the lines are consistently lower than their equilibrium vapor pressures at the temperature of the line walls. The vapors of organic monomers A and B individually transferred with a carrier gas are fed to a shower head 7 in the reaction chamber 1 to mix up, and then sprayed onto the surface of a substrate 4. Meanwhile, a plasma is induced between the shower head 7 and the substrate heating unit 6 by supplying an RF power from RF power 9 via matching box 10. Accordingly, during passing through the induced plasma space, the organic monomer A and B molecules are both excited up to the activated state thereof to reach the substrate surface. Then, when being adsorbed on the surface of the substrate 5 heated by the substrate heating unit 6, the pre-activated organic monomers A and B molecules are added with further thermal energy thereby to be rapidly copolymerized, resulting in growth of an insulating film of copolymer 4 on the surface of the semiconductor substrate 5.

Some part of the organic monomers A and B molecules activated by plasma are detached after attaching themselves to the substrate surface. However, since there is competition between "detachment" and "polymerization", a probability of "detachment" is more significant when using only a thermal process (i.e. "MVP" method) and when using a plurality of monomers, these monomers have different detachment probabilities. Thus, good controlling a content ratio in a copolymer may be attained by controlling a feeding ratio in a wider range, and taking into detachment probabilities of the individual monomers into account. On the other hand, in a "plasma polymerization method", pre-activated organic monomers A and B molecules can be copolymerized immediately after adsorption. Influence of "detachment" is, therefore, insignificant, so that a content ratio in a copolymer may be more easily controlled. In this respect, it is more desirable to apply a "plasma polymerization method" to this invention.

Furthermore, in some cases, during activation by plasma, some activated monomers may be mutually polymerized in a vapor phase to be turned into dimers or trimers, which may be then adsorbed on the surface of the substrate. In such cases, organic monomers A and B are mixed under a reduced pressure where each gaseous molecule has high mobility so that they will form their dimers or trimers in proportion to the mixing ratio thereof. As a result, an insulating film of copolymer in which organic monomers A and B are homogeneously blended is also obtainable in such a case. Alternatively, when using a plurality of monomers having widely different equilibrium vapor pressures (saturation vapor pressures), there may be more possibility for the film to be affected by the aforementioned influence of the difference in detachment probabilities. However, when such partial copolymerization is intentionally initiated in the plasma to form dimers or trimers, equilibrium vapor pressures (saturation vapor pressures) for these dimmers or trimers obtained are significantly lower than those for the monomers, so that the influence of detachment concerned can be eliminated. For example, even when there is as large difference as of three-order in an equilibrium vapor pressure (saturation vapor pressure) between the monomers, the approach described above may be applied to substantially eliminate a difference in a detachment probability and thus an in-plane composition distribution (variation) may be negligible for the insulating film of copolymer itself formed on the surface. From this additional advantage, it is again concluded to be desirable to use a "plasma polymerization method" in this invention for further extending applications of the invention.

When spraying the plurality of organic monomers used onto the substrate surface as a gas mixture, it is necessary to keep a content ratio of the organic monomers contained in the gas mixture uniform at any region of the substrate surface. The uniform mixture may be achieved by homogeneously mixing in the reaction chamber 1, for example, by mixing in the shower head 7 equipped in the reaction chamber 1 as described above. Alternatively, the monomers may be blended together in advance in the course of the flow line prior to their introduction into the reaction chamber 1, and then introduced together into the reaction chamber 1. Such beforehand mixing in the course of the flow line may be achieved by joining the lines as shown FIG. 1, or alternatively, by using a mixing chamber to mix up the gases during their residence in the chamber.

As the reaction chamber 1 is evacuated by the vacuum pump 8 and its walls are kept at temperature of heating up in similar manner to the vaporized material feeding lines 38A, 38B, the unreacted starting monomers are kept in a gas phase to escape from adhesion or coagulation on the walls therein, and thereafter they reach a cooling trap 14 through an evacuation line 16 heated by a heater. In the cooling trap 14, since a temperature of a trap surface is sufficiently low, gaseous starting monomers A and B are coagulated on the trap surface and thus liquefied or solidified in the cooling trap 14. As a result, the unreacted starting monomers are captured or removed in the cooling trap 14, and only the carrier gas after removal of the starting monomers and gases used for plasma generation flow down to the exhaust pump 8.

FIG. 2 is a view schematically showing a configuration of a vapor feeding system used in the case of an organic monomer used in this invention being liquid, where the liquid organic monomer is vaporized and fed together with a carrier gas. It shows a portion thereof including from an organic monomer A tank 23A, through vaporization in a vaporization controller, to a reaction chamber. The case where an organic monomer used is of monomeric type is illustrated in the following description, but the same principle is applicable also to such a case using an organic oligomer of dimeric type organic monomer A 22A is supplied to a vaporization controller A 30A via a valve 46A, a liquid flow indicator A 28A and a valve 43A, and it is further fed into a vaporization chamber A 32A via a vaporization controlling valve A 35A, which is feedback controlled from a liquid flow indicator 28A for organic monomer A, and a valve 37A in a vaporization controller A. On the other hand, a carrier gas A 26A is supplied to the vaporization controller 30A via a valve 45A. Thus, the liquid starting monomer A 22A and the carrier gas A 26A are mixed just before the vaporization chamber A 32A. The liquid starting monomer A 22A fed into the vaporization chamber A 32A which is mixed with the carrier gas A, is continuously vaporized by heating with thermal energy from a heater 34A in the vaporization chamber 32A being evacuated. That is, thermal energy consumed as an evaporation heat and cooling effect due to expansion of the carrier gas caused by abrupt pressure reduction are compensated by thermal energy supplied by heating with the heater 34A. Thus, the temperature of those gases are elevated, and then the vaporized starting monomer A is fed into the reaction chamber 1 via the vaporized material feeding line 38A and the valve 18A heated up by the heater 3.

FIG. 3 is a view schematically showing a configuration of a system (vapor feeding system) use in the case of an organic monomer used in this invention being liquid, where the vapor of organic monomer is generated and fed. It shows a portion thereof including from an organic monomer B tank 23B into which a carrier gas 26B is fed, to a vaporized material feeding line 38B used for feeding into a reaction chamber. The case where an organic monomer used is of monomeric type is illustrated in the following description, but the same principle is applicable also to such a case using an organic oligomer of dimeric type. A carrier gas B 26B is supplied to an organic monomer B tank 23B while being regulated to a given flow rate by a gas flow controller 31B. The organic monomer B tank 23B is heated to a constant temperature. The temperature is selected such that the organic monomer B is vaporized from a melt state or sublimed from a solid state to give a sufficient saturation vapor pressure. The vapor of monomer B vaporized is mixed with a carrier gas B supplied, and fed into a vaporized material feeding line 38B via a valve 46B, a gas flow indicator B 33B and a valve 43B, and further it is fed into the reaction chamber 1 via a valve 41B. In that case, in the organic monomer B tank 23B, a partial pressure of the organic monomer B gas contained in the carrier gas B is substantially equal to an equilibrium vapor pressure (saturation vapor pressure) thereof at the temperature. Thus, a feeding amount of the organic monomer B per a unit time is governed by a flow rate of the carrier gas B.

As described above, whether a starting organic monomer is liquid or solid at a room temperature, a vapor feeding system suitable to its state can be selected to feed a gaseous organic monomer into a reaction chamber with quick response to an aimed change of its feeding rate. If an organic monomer which is gaseous at an room temperature can be used, it may be selected from systems for supplying in similar way to a conventional gaseous material. Further, in this invention, a carrier gas used for feeding an organic monomer may be appropriately an inert gas to the organic monomer mixed, such as helium, argon and neon gases.

In a process for forming a copolymer film according to this invention, as for organic monomers used therein, it is possible to utilize any monomer may be as long as its polymerization reaction can occur when used as a single monomer, and reaction of its polymerization with at least one of other organic monomers can also occur. A monomer having an openable ring structure and an addition-polymerizable ethen-1,2-diyl (—CH═CH—) structure such as vinylene group as reactive moieties involved in reaction of polymerization may be one suitable example because reaction of homopolymerization of the single monomer can be easily carried out by itself via polymerization between these moieties. In addition, when applied to an insulating film used in a semiconductor device, a copolymer film formed is desirably adhesive to another semiconductor material. Therefore, it desirably has a structure endowing such adhesiveness, for example, a silicon-containing structure, more specifically a siloxane bond (Si—O) structure. In this respect, such a monomer containing a silicon atom or having a siloxane bond (Si—O) structure in the molecule may be used as either one of organic monomers, which can introduce an adhesiveness-improving structure into a copolymer film to be formed. For example, at an initial step of film deposition on a base surface, among the plurality of organic monomers used in the initial stage of film deposition, a feeding ratio of a monomer containing a silicon atom or having a siloxane bond (Si—O) structure in the molecule may be set higher to grow, in an interface thereof, a copolymer in which a surface density of silicon or the siloxane bond (Si—O) structure is higher, resulting in more improved adhesiveness.

EXAMPLES

This invention will be more specifically described with reference to Examples. These examples illustrate the most preferred embodiments of this invention, but the invention is not limited to them in any manner.

Example 1

There will be provided description of a series of processes where with use of DVS-BCB monomer (divinylsiloxane bis(benzocyclobutene) monomer) represented by formula (I) as organic monomer A and BBB monomer (bis(benzobutenyl)butadiene monomer) represented by formula (II) as organic monomer B, film growth for a film of copolymer of DVS-BCB and BBB gases is attained by starting from a mixture of these vaporized gases.

The DVS-BCB and BBB monomers contain benzocyclobutene and ethen-1,2-diyl (—CH═CH—; vinylene) groups as structures involved in polymerization. The polymerization may be understood to proceed via the following path. First, a reaction represented by chemical equation (V) occurs to open the four-membered carbocyclic ring in the benzocyclobutene group, forming two vicinal alkylidene structures ($CH_2$═).

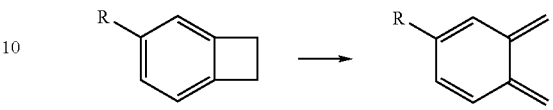

Reaction equation (V): Ring opening of a benzocyclobutene group

Then, the ring opening moiety being converted into the two vicinal alkylidene structures ($CH_2$═) react with the ethen-1,2-diyl group (—CH═CH—) to form a six-membered ring structure. Thus, the polymerization represented by chemical equation (VI) proceeds.

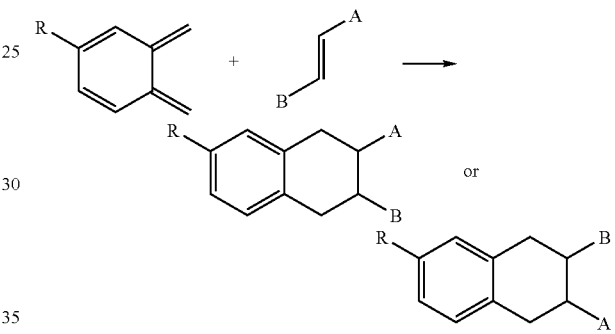

Reaction equation (VI): polymerization of a ring-opening moiety of benzocyclobutene with a vinylene structure Since the DVS-BCB and BBB monomers have the benzocyclobutene and the ethen-1,2-diyl (—CH═CH—; vinylene) groups in one molecule, homopolymer films composed of a skeleton-unit of the monomer itself, i.e., a DVS-BCB polymer film or BBB polymer film, are respectively grown even when using a single monomer alone. The DVS-BCB monomer contains a structure of a siloxane bond (Si—O) in the molecule while the BBB monomer does not have such a structure. The siloxane structure is retained after the polymerization and may interact with a semiconductor material surface to contribute significantly to adhesiveness.

Although the aforementioned ring-opening and addition reaction between the benzocyclobutene group and the vinylene structure may be initiated only by heating, for instance, the benzocyclobutene moiety thereof is set in its excited states by plasma energy in advance so that the reaction thereof can be proceeded by adding a less thermal energy. Therefore, a gas mixture of the DVS-BCB monomer and the BBB monomers may be activated with plasma energy by passing through a plasma just before spraying on a substrate, so that when the gases reach the heated substrate, ring opening of the benzocyclobutene group and the subsequent reaction for additive ring-formation with the vinylene structure can be accelerated by the thermal energy therein, to form a copolymer film (DVS-BCB/BBB copolymer film) composed of skeletons of the DVS-BCB and the BBB units formed in a network structure, which is represented by formula (VII):

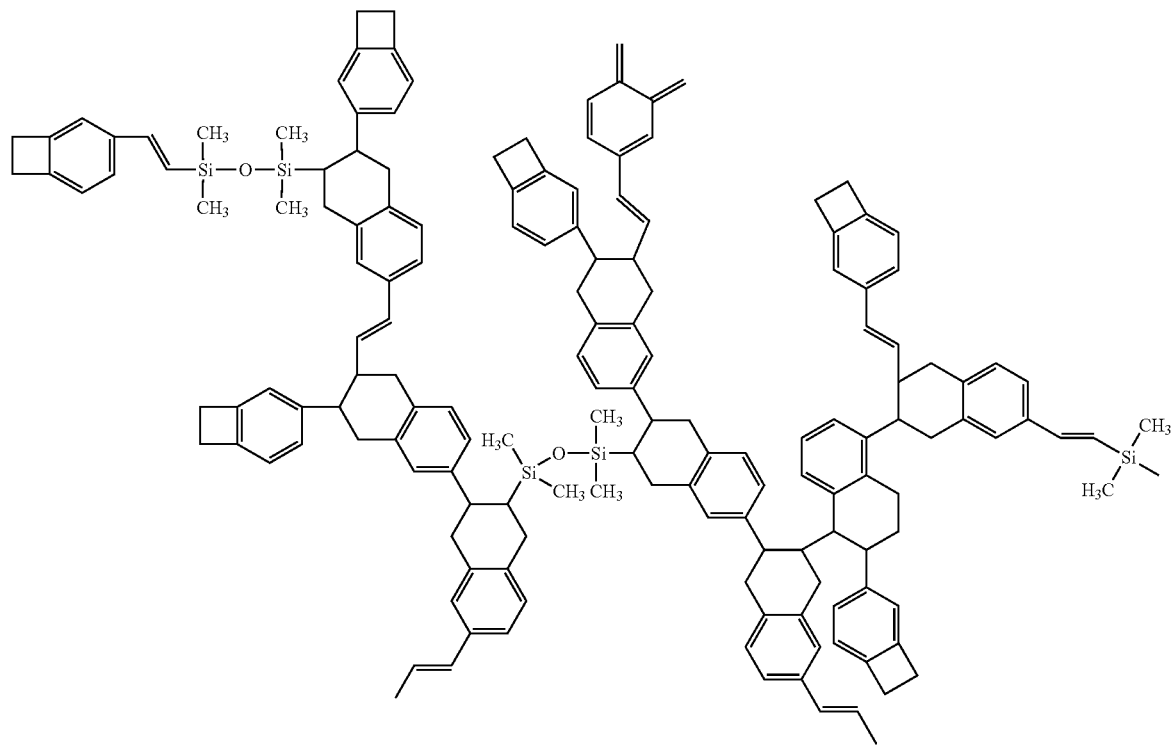

(VII): DVS-BCB/BBB copolymer film.

In this drawing, there remain a plurality of unopened cyclobutene rings, but in practice, copolymerization may proceed to a sufficient level that the unreacted cyclobutene rings are not detected by FT-IR spectrometry. Furthermore, conversion of Si—CH$_3$ bonds into Si—H bonds in the siloxane structure or opening of some benzene rings thereof is sometimes observed. In practice, during the thermal process after activation by plasma, reactions other than ring opening of the cyclobutene ring or addition/insertion with vinylene groups thereto occur, and it is understood that along with their predominant reactions, copolymerization via a variety of intermediate active species shown below, which is caused by the thermal process due to plasma activation and heating of the substrate, may also progress.

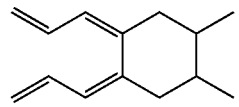

Replacement of Methyl With Hydrogen

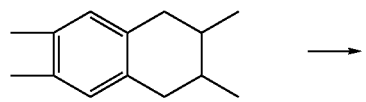

-continued

Opening of a Benzene Ring

The feature of this reaction is characterized in that molecules other than starting monomers are not involved in the polymerization and that no byproducts from the polymerization are formed. As both DVS-BCB monomer and BBB monomer are pre-mixed in vapor phase, they exhibits a higher mobility for surface diffusion after being adsorbed on the substrate surface, to give a copolymer film in which they are almost ideally mixed together. In the DVS-BCB/BBB copolymer film thus formed, when the molar amounts for feeding of the DVS-BCB monomer and the BBB monomer gases are equal, a density of the siloxane structure (—Si—O—Si—) thereof is a half of that for a homopolymer film formed from the DVS-BCB monomer alone. The siloxane structure is suitable for, for example, improving adhesiveness to the base silica film or mechanical strength of the polymer film, but the structure itself containing silicon and oxygen atoms exhibit its large polarizability, which might be a factor for inhibiting reduction of a dielectric constant. For example, a film of plasma-polymerized DVS-BCB polymer has a dielectric constant (K) of 2.6 while a film of DVS-BCB/BBB (50%:50%) copolymer has K=2.4 to 2.2. Furthermore, when a ratio of BBB is 100%, K is about 2.0 to 1.8.

A process for forming a film of copolymer using the DVS-BCB monomer and the BBB monomer gases will be explained in detail by referring an example case with use of an apparatus for depositing a copolymer film shown in FIG. 1. The explanation is made for the case using divinylsiloxane bis(benzocyclobutene) monomer (DVS-BCB monomer) for an organic monomer A therein and bis(benzobutenyl) butadiene (BBB) monomer for an organic monomer B, respectively. All of a carrier gas 26, a purge gas and a pressure delivery gas 27 used are helium (He). A cleaning gas 21 used for cleaning the inner part of a reaction chamber is a gas mixture of $NF_3$ and oxygen or of $SF_6$ and oxygen or ozone. Alternatively, a gas mixture of a fluorocarbon such as $CF_4$ and $C_2F_6$ and oxygen or ozone may be used. Vaporization of an organic monomer will be here described in detail for the DVS-BCB monomer.

First, at an initial stage of the vaporization controller in the apparatus for growth of a copolymer film (FIG. 1), the valve 37 in the vaporization controller 30, valves 41 and 49 are set to "open" to vacuum up the reaction chamber 1, the evacuation line 16, the waste line 15, the vaporization chamber 32 and the vaporized material feeding line 38 by an exhaust pump 14. A vaporization temperature is desirably a temperature sufficient to ensure a required amount of the organic monomer supplied, but it should be selected from temperatures being attended without any disadvantage in deterioration such as decomposition and polymerization of the organic monomer itself and resultant line occlusion in a line feeding the organic monomer to be vaporized into the vaporization chamber. A line member such as a vaporized material feeding line 38 heated by the heater 3 must be tolerant to the heating temperature, or alternatively conditions must be selected such that a heating temperature is set within a temperature range where the line member used has a good heat-resistance. A temperature of the line heated up is monitored by thermocouples placed at several points in each of the lines for controlling an output of the line heater to consistently keep a predetermined temperature thereof. The valve 45 of the vapor feeding system shown in FIG. 2 is set to "open" to supply to the vaporization controller 30 with a carrier gas (He) 26 from the carrier gas feeding line via the gas flow controller 31, and further the carrier gas is fed to the reaction chamber 1 via the vaporized material feeding lines 38, 18, and finally discharged from the apparatus through an exhausting line 16 by a vacuum pump 8. In the case of this process, a vaporization temperature is set at 210° C. On the other hand, a flow rate of the He carrier gas is set to be 500 sccm. Under these conditions, the total pressure P in the vaporization controller is 7 Torr while an internal pressure of the reaction chamber 1 is 2.0 Torr. In addition, using an unit for substrate heating 6 placed in the reaction chamber 1, a silicon substrate (semiconductor substrate) 5 on which a semiconductor integrated circuit is formed is heated to 400° C. In the case using the DVS-BCB monomer and the BBB monomer, it is suitable to select a heating temperature of the substrate during film deposition within a range of 200° C. to 450° C.

By the vaporizing and feeding systems for organic monomer 61, 62 as shown in FIG. 2, the DVS-BCB and the BBB monomers with He carrier gas are fed into the reaction chamber 1 via the vaporized material feeding lines 38A, 38B, respectively, and then mixed together. By means of the shower head 7 in the reaction chamber 1, a gas mixture of the DVS-BCB and BBB monomers is dispersed and sprayed onto the surface of the substrate 5. An RF power of 13.56 MHz is applied between the shower head 6 and the surface of the substrate heating unit 6 being grounded to generate plasma of He used as the carrier gas under the shower head 7. It is essential that the RF power is 100 W or less, preferably 50 W or less to keep a plasma energy to a level where only the polymerizable groups (i.e. a four-membered carbocycle of benzobutene ora vinylene group) present in the DVS-BCB and the BBB monomer molecules are activated. The gas mixture of the DVS-BCB and BBB monomers is sprayed on the semiconductor substrate 5 through the He plasma, which activates the monomers comprised therein. The pre-activated DVS-BCB and BBB monomers are copolymerized on the surface of the substrate heated to 400° C., to form a film of copolymer (organic insulating film) composed of the skeleton units derived from the DVS-BCB and the BBB monomers. During this process, a carrier gas containing the unreacted DVS-BCB and BBB monomers reach an evacuation line 16, and a cooling trap 14 cooled to about 20° C. that is inserted before the exhaust pump re-liquefies the DVS-BCB and the BBB monomers to prevent them from entering the exhaust pump 8. The DVS-BCB and the BBB monomers are fed until the total feeding comes to a predetermined amount to continue deposition. After that, each supply is stopped and then the semiconductor substrate 5 in the reaction chamber is drawn back.

A relative ratio of supplying amounts between the DVS-BCB monomer and the BBB monomer gases may be varied during deposition, to give a film of copolymer in which a content ratio between the DVS-BCB and the BBB units, i. e., a structure (composition) varies in a thickness-direction of the film deposited thereby. For example, the DVS-BCB monomer alone is fed at a flow rate reduced to a mass flow basis of 0.15 g/min for 30 sec., and then the DVS-BCB and the BBB monomers are simultaneously fed at flow rates reduced to a mass flow basis of 0.15 g/min and 0.10 g/min, respectively, for 1 min. After stopping feeding of the BBB monomer, the DVS-BCB monomer alone is fed at a flow rate reduced to a mass flow basis of 0.15 g/min for 30 sec. Alternatively, while keeping a supplying amount of the DVS-BCB monomer at 0.15 g/min, a feeding rate of the BBB monomer may be increased from 0 g/min to 0.1 g/min for initial 30 sec., kept at 0.1 g/min for 1 min and then lessened from 0.1 g/min to 0 g/min for the next 30 sec. Either case of the procedures mentioned above provides a film of copolymer where a density ratio between the DVS-BCB and the BBB skeleton units contained varies continuously relative to variation in a relative feeding ratio.

Figure 4:
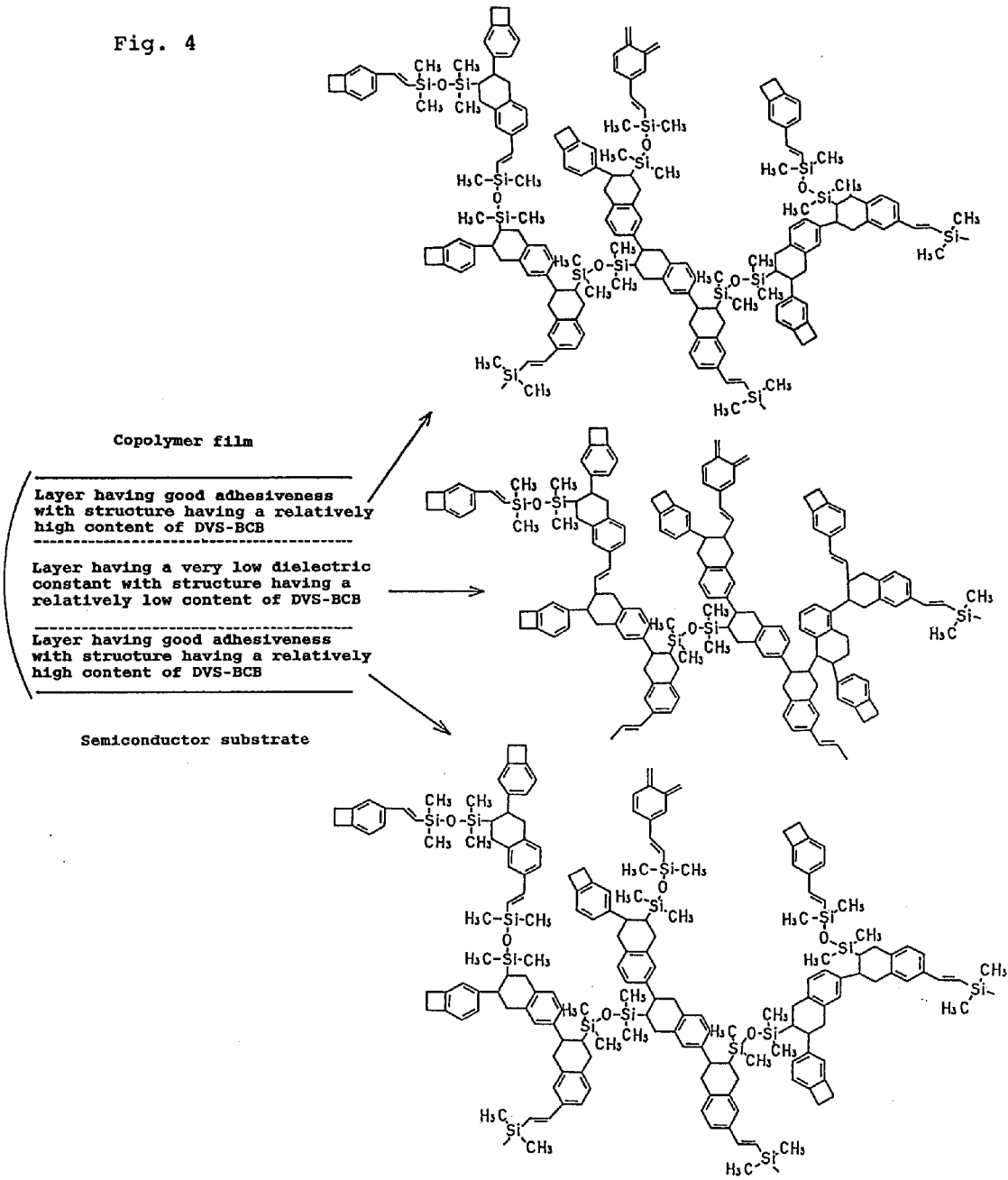
FIG. 4 schematically illustrates each of copolymer structures for layer regions contained in a film of polymer having a three-layered structure formed in an embodiment of this invention.

As shown in FIG. 4, the film of polymer obtained thereby is a film of copolymer having a three-layer structure due to such deference in composition that a content of the DVS-BCB skeleton unit is relatively higher in the regions near the upper and the lower interfaces thereof. In this three-layer structure, with respect to the parts of upper or lower layers where a content of the DVS-BCB skeleton unit is relatively higher, for example, the surface density of the siloxane structure derived from the DVS-BCB skeleton unit at an interface with the base surface is higher so that it is a film of copolymer being excellent in adhesiveness to another semiconductor material. Furthermore, for the part of intermediate layer other than the upper and the lower layers, a feeding ratio of the BBB monomer to the DVS-BCB monomer may be increased to give a film of copolymer of DVS-BCB/BBB with the intermediate layer containing a lower content of the DVS-BCB skeleton but a higher content of the BBB skeleton relatively. In this film of copolymer having such an intermediate layer containing a relatively larger amount of the BBB skeleton, a density of the siloxane structure containing oxygen and silicon therein is very low, and the relative bulk density thereof is also reduced. As a result, the film provides a lower dielectric constant than that of a film of homopolymer of DVS-BCB comprising no BBB skeleton. In FIG. 4, the film is shown as a stacked film consisting of three types of layers having different structures for illustration. In practice, however, since the amount of feeding for each of the monomers is independently controlled, and the amount of feeding therefor is continuously changed during continued deposition of the film, it is a film of integrated copolymer as a whole in which a copolymer chain is continuous between the layers and thus a composition therein continuously varies. Furthermore, an abrupt change in the amount for feeding may be made to give a structure having a transient region with a sharp composition change. Although the BBB monomer is used as organic monomer B in this example, for instance, in place of the BBB monomer, a BBB monomer derivative represented by general formula (III) may be used, which has a structure where an additional unsaturated hydrocarbon group is added to the butadien-1,4-diyl group (—CH=CH—CH=CH—) of the BBB monomer:

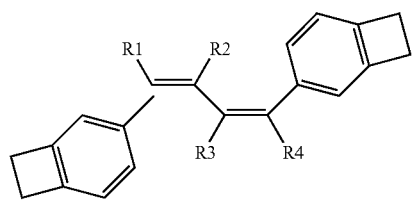

(III) Unsaturated-hydrocarbon-added BBB monomer derivative wherein R1, R2, R3 and R4 independently represent hydrogen or unsaturated hydrocarbon.

Although the case using a combination of the DVS-BCB and the BBB monomers both of which contain a benzocyclobutene ring and a vinylene moiety as starting organic monomers is discussed in Example 1, any monomer with a structure having two benzocyclobutenes therein as represented by general formula (VIII) may be used as another starting organic monomer in combination with the DVS-BCB monomer instead of the BBB monomer:

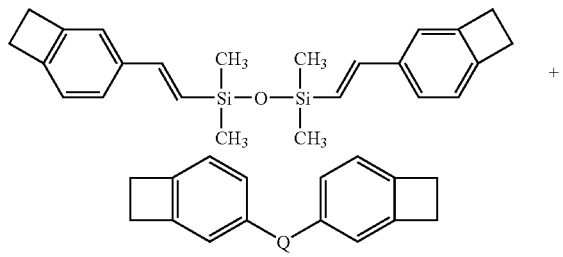

(VIII) Bis(benzocyclo) derivative copolymerizable with DVS-BCB

Some examples of a bivalent group which can be used as Q in the bis(benzocyclo) derivative represented by general formula (VIII) are presented below:

(1) an ethyl group: —CH$_2$—CH$_2$— or an unsaturated hydrocarbon chain;
(2) a vinylene group (ethen-1,2-diyl group): —CH=CH—;
(3) a butadien-1,4-diyl group: —CH=CH—CH=CH—;
(4) an alkadien-diyl type group:

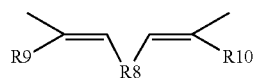

where R8 represents unsaturated hydrocarbon group; and R9 and R10 represent hydrogen or unsaturated hydrocarbon;
(5) an ethyndiyl group: —C≡C—;
(6) a hex-1,5-diyn-1,6-diyl type group: —C≡C—C—C—C≡C—;
(7) an m-phenylene group:

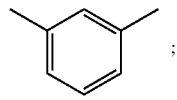

(8) an 1,3-divinylbenzene-β,β'-diyl group:

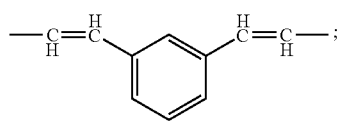

(9) a benzene-1,3-dicarbonyl group:

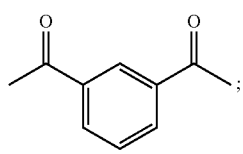

(10) a 2,2-diphenylpropane-4,4'-bis(oxycarbonyl) group:

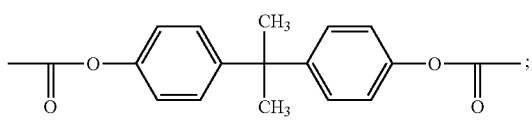

(11) a heptane-1,7-diaminocarbonyl group:
—CO—NH—(CH$_2$)$_7$—NH—CO—;
(12) a butane-1,4-dioxycarbonyl group:
—CO—O—(CH$_2$)$_4$—O—CO—.

As described above, in a process for deposition according to this invention, a structure (composition) in thickness direction of a film can be continuously varied by independently and continuously controlling the amounts of feeding for a plurality of organic monomer gases used as starting materials during deposition. Taking advantage of the feature, a film of copolymer formed in an interface with another material may have good adhesiveness and film mechanical strength, and subsequently, a film of copolymer having a lower effective dielectric constant may be continuously formed. Furthermore, since vapor phase growth under a reduced pressure is used, rates and mobilities of diffusion for the organic monomers are so large that the plurality of monomer gases can be mixed well into form of idealmixture state to be sprayed on a surface of a base, and there may be provided a film of polymer in which a structure (composition) continuously varies in its thickness direction while keeping high uniformity for an in-plane composition (structure) of the copolymer film formed on the surface.

Although there has been described copolymerization of the DVS-BCB monomer with the bis(benzocyclo) derivative as an example, a plurality of different kinds of bis(benzocyclo) derivatives may be, of course, also used to form a film of copolymer composed of a plurality of monomer units as skelrtons thereof. For example, this method may be applied to vapor phase growth of a film of copolymer by means of copolymerization of the unsaturated-hydrocarbon-added BBB monomer of general formula (III) with the BBB monomer of formula (II). In that case, a film of copolymer formed therewith does not, of course, have a siloxane structure. When using the unsaturated-hydrocarbon-added BBB monomer of general formula (III) alone, a film of polymer obtained thereby has a lower bulk density than that obtained when using the BBB monomer alone. Thus, it is a film of polymer having a lower effective dielectric constant.

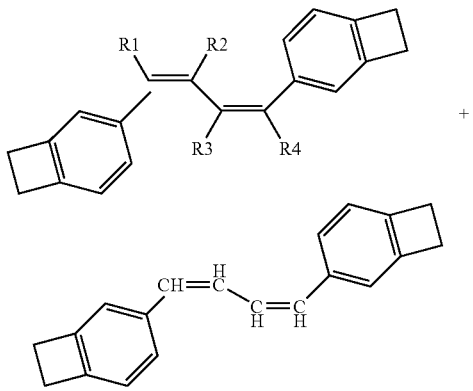

Copolymerization of the unsaturated-hydrocarbon-added BBB monomer with the BBB monomer provides a film of copolymer represented by formula (IX):

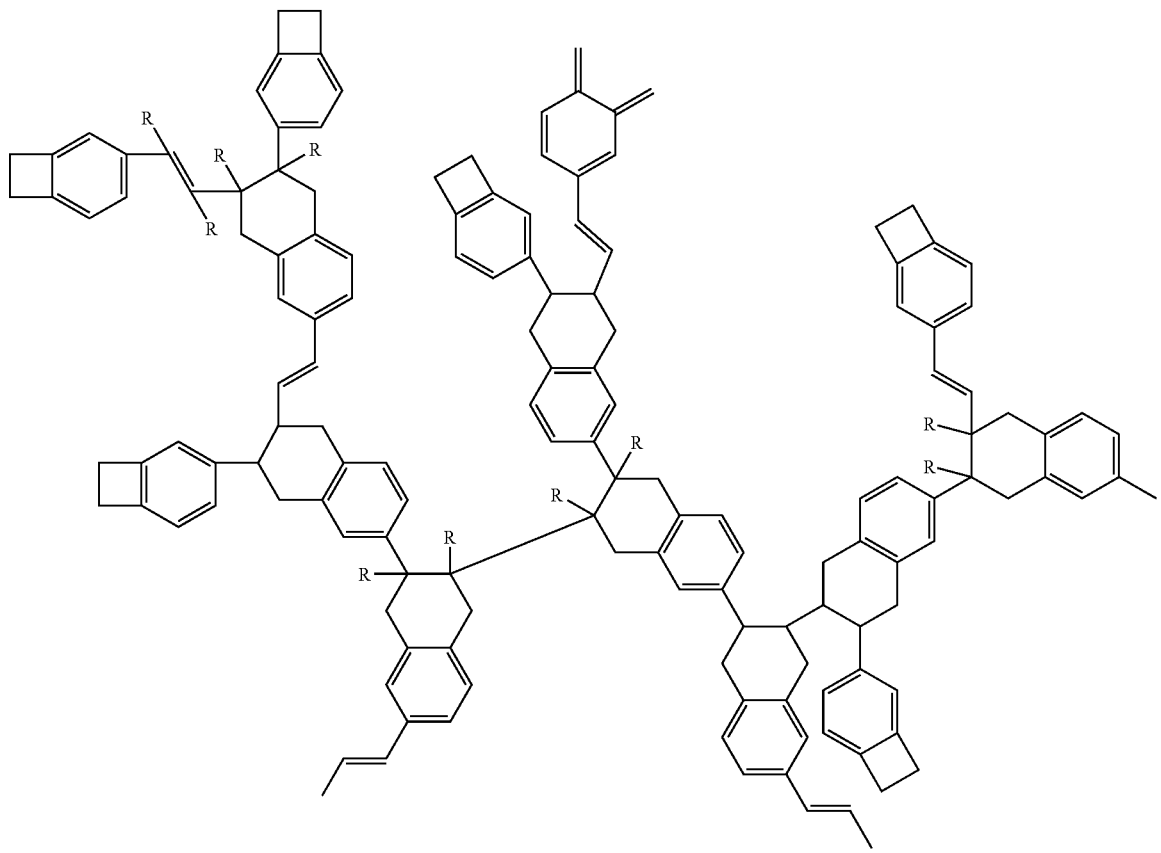

Copolymer film of the unsaturated-hydrocarbon-added BBB monomer with the BBB monomer For example, when all of R3, R4, R5 and R6 are methyl, a film of polymer obtained therewith has a lower dielectric constant by 25% than that obtained when using the BBB monomer alone. A system employing the following copolymerization reaction of a starting monomers combination of the BBB monomer with addition of an unsaturated hydrocarbon group of general formula (III) and the BBB monomer of formula (II):

When a relative ratio of feeding amounts between the two is continuously varied during the film deposition, the film of copolymer obtained by the vapor phase growth is a film of copolymer where a bulk density continuously varies in its film thickness direction.

Example 2

A growth process of a film of copolymer of the DVS-BCB monomer and a naphthalenedicyclobutene (NCB) monomer where a combination of DVS-BCB and NCB, which is shown in the following formula:

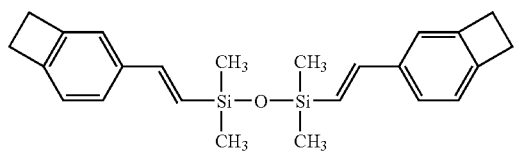

+

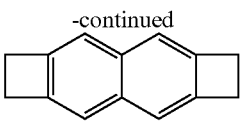

-continued

Copolymerization of DVS-BCB with naphthalenedicyclobutene (NCB), is selected as starting organic monomers thereof will be explained in this example. The NCB monomer also has two structures of cyclobutene ring type in the molecule. As the reaction of six-membered ring formation between the cyclobutene ring structure and the vinylene moiety in the DVS-BCB monomer may occur via the ring-opening and the addition reactions as described above, a film of copolymer of DVS-BCB and NCB, which is represented by formula (X):

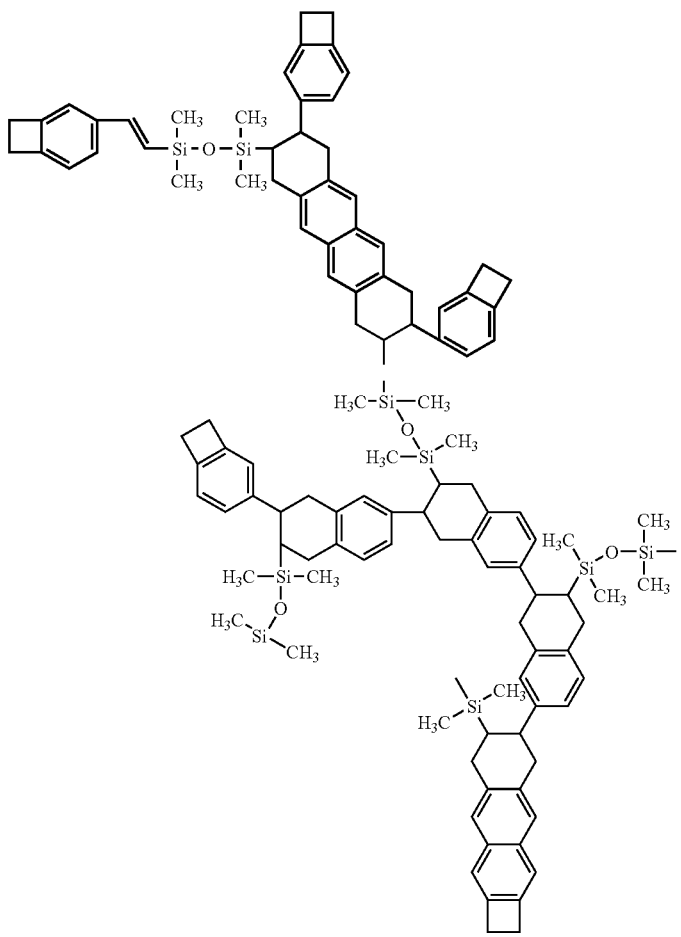

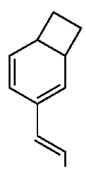

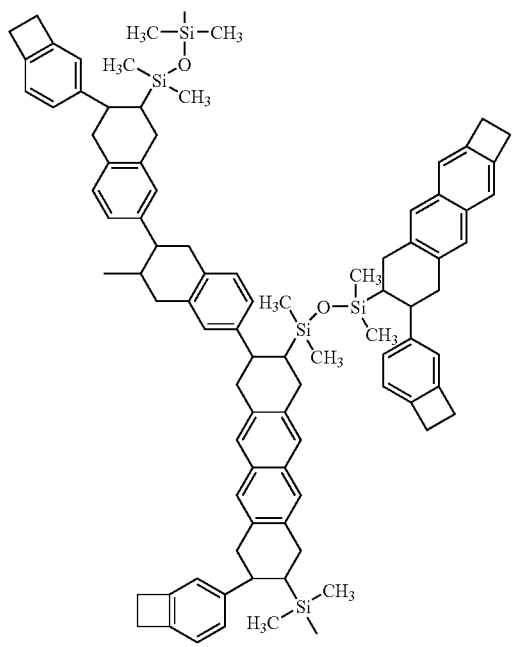

(X) DVS-BCB/NCB copolymer, may be vapor phase grown by a similar method to the plasma polymerization method as described in Example 1.

Alternatively, since naphthalenedicyclobutene (NCB) is solid at a room temperature, a system for vaporizing and feeding with constitutions illustrated in FIG. 3 is used for its vaporization. Even when a monomer having increased number of fused benzene rings in the molecule, such as phenanthrenedicyclobutene represented by formula (XI):

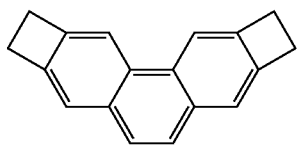

(XI): Phenanthrenedicyclobutene is used in place of NCB, a film of copolymer of such a monomer of fused ring compound with DVS-BCB can be grown by the same way, as long as it is possible to vaporize them and to obtain a desired equilibrium vapor pressure thereby.

Example 3

A growth process of a film of copolymer of the DVS-BCB, monomer and a benzovinyl-benzocyclobutene monomer (BV-BCB: (2-phenylvinyl)benzocyclobutene) where a combination of DVS-BCB and BV-BCB, which is shown in the following formula:

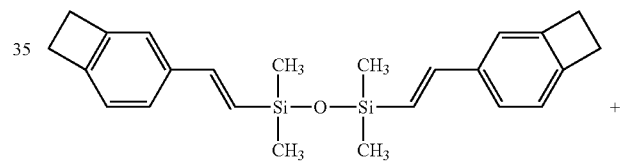

+

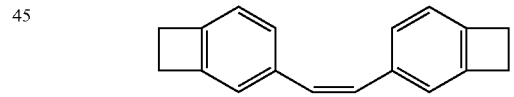

Copolymerization of DVS-BCB with BV-BCB, is selected as starting organic monomers thereof is described in this example. The BV-BCB monomer also has a cyclobutene ring structure and a moiety of vinylene group in the molecule, and polymerization by itself can be, therefore, progressed through the reaction of six-membered ring formation via a ring-opening and an addition reactions thereof. That is, polymerization with use of BV-BCB alone may occur to vapor phase deposit a film of BV-BCB polymer.

When using a combination of these two organic monomers, BV-BCB may utilize the cyclobutene ring structure and the moiety of vinylene group contained in the molecule for its copolymerization with DVS-BCB to vapor phase grow a film of copolymer having a framework represented by formula (XII):

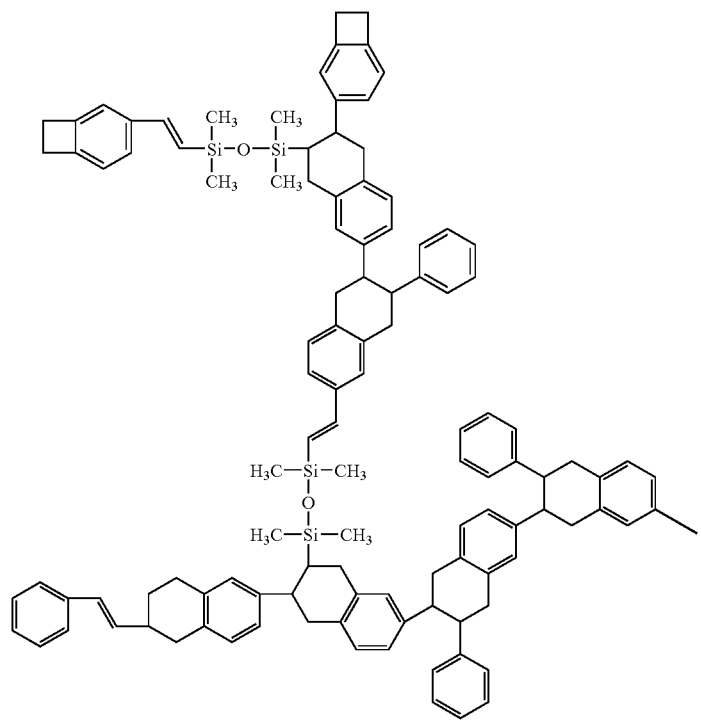
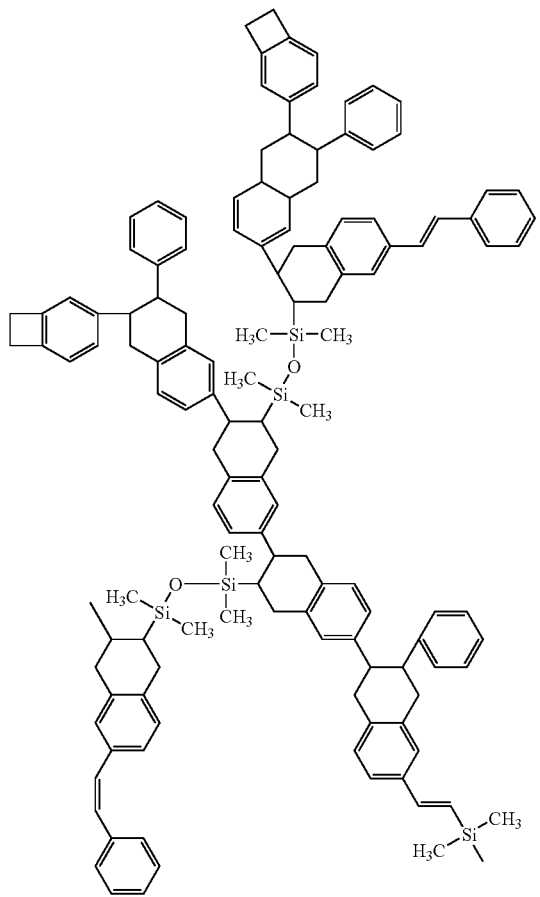

(XII): DVS-BCB/BV-BCB copolymer film. In this copolymer film, since BV-BCB has only said two moieties as the structures involved in polymerization, a density of cross-linkage therein is smaller, resulting in a larger percentage of vacant space therein. As a result, a film of copolymer obtained will be a film having a dielectric constant of 2 or lower. Furthermore, instead of BV-BCB, vinylbenzocyclobutene may be used.

Vinylbenzocyclobutene:

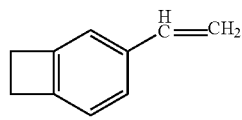

Example 4

In example 4, such a case that when making up a multilayer interconnection structure in an MOSFET device, a film of copolymer formed by a process of this invention is applied for one of insulating films therein will be described. FIG. 5 is a section view schematically showing an example of multilayer interconnection structure in an MOSFET device. In the constitution shown in FIG. 5, a film of DVS-BCB/BBB copolymer described in Example 1 is applied to an interlayer insulating film which insulates between three-layer of copper interconnections 85, 87, 89 (M1, M2, M3) over an MOSFET 82 formed in a silicon substrate 81.

The first layer of copper interconnection (M1) 85 is formed on a copper contact plug 83 that is formed in an inorganic interlayer insulating film 84 on the MOSFET. On the surface of the inorganic interlayer insulating film 84, a very thin film of silicon nitride 90 with a thickness of 10 nm or less is formed as a barrier capping film to copper diffusion. An inter-interconnection insulating film 91 for the first layer of copper interconnection 85 has a three-layer structure comprising a DVS-BCB polymer film 91a, a DVS-BCB/BBB copolymer film 91b and a DVS-BCB film 91c. That is, the DVS-BCB films 91a, 91c being excellent in adhesiveness to the silicon nitride film and mechanical strength are posted for interface layers thereof in contact with the barrier capping film to copper diffusion 90 used as a base and with the barrier capping film to copper diffusion formed on the inter-interconnection insulating film 91, respectively. Specifically, DVS-BCB films having a dielectric constant k of 2.5 are used, which contain two siloxane bonds (Si—O) per one unit thereof to exhibit good mechanical strength and adhesiveness to the copper diffusion barrier film. On the other hand, the DVS-BCB/BBB copolymer film 91b being an intermediate layer therein has a DVS-BCB skeleton content of less than 50% so that the density of siloxane bond (Si—O) associated with the DVS-BCB skeleton therein is half as much as that in the DVS-BCB polymer film 91a, and thus it has a dielectric constant k of 2.1. An effective dielectric constant of this polymer film with the three-layer structure used as the insulating film for the first layer of inter-interconnections depends on a thickness ratio of the DVS-BCB polymer film to the DVS-BCB/BBB copolymer film. Therefore, for reducing a dielectric constant, it is desirable that the total thickness of the upper and the lower DVS-BCB films is about 20% of the thickness of the intermediate DVS-BCB/BBB copolymer film. For example, when a thickness of the copper interconnection 85 buried by the polymer film with the three-layer structure is 300 nm, the total thickness of the polymer film is 300 nm, in which thicknesses selected for the DVS-BCB polymer film 91a, the DVS-BCB/BBB copolymer film 91b and the DVS-BCB polymer film 91c are 15 nm, 270 nm and 15 nm, respectively. In this case, the overall effective dielectric constant of the polymer film is about 2.2 to 2.3.

This layered type film of copolymer was grown using a deposition apparatus for a copolymer film shown in FIG. 1. In this example, the temperature for heating the substrate was set at 425° C., and RF power of 50 W was applied to the shower head 7 with use of He gas as a carrier gas to generate He plasma. First, at the early stage of film deposition, only DVS-BCB monomer was fed to grow the DVS-BCB polymer film 91a to 15 nm. Then, the conditions were set such that the DVS-BCB and the BBB monomers are fed at an equal molar amount, for example, the feeding amounts per a unit time were set to 0.15 g/min for the DVS-BCB monomer and to 0.1 g/min for the BBB monomers, respectively, and deposition under the conditions was continued 2 min to grow the DVS-BCB/BBB copolymer film 91b with a thickness of 270 nm. Sequentially, supply of only DVS-BCB monomer was again selected to grow the DVS-BCB polymer film 91c to 15 nm.

Alternatively, while keeping the feeding amount of the DVS-BCB monomer constant, the feeding amount of the BBB monomer can be sequentially increased and decreased to form a film of DVS-BCB/BBB copolymer of which all the layers in the three-layer structure have different compositions, in particular a content of the siloxane bond (Si—O) contained in the film being higher in the regions near the interface with the base and the surface while being gradually lowered in the intermediate layer. In an interconnection groove formed in the insulating film for the first layer of interconnections, the first layer of single-damascene type copper interconnection 85 whose sides and bottom are coated by a TaN barrier film with a thickness of 10 nm is formed.

Then, on the first copper interconnection, a barrier film to copper diffusion 90 with 10 nm thickness is deposited, and the second interconnection insulating film 92 is grown thereon. In the second interconnection insulating film 92, a dual damascene copper interconnection composed of the second layer of copper interconnection 87 and a via 86 bound to the first layer of interconnection is formed. In this case, a film of three-layer structure is grown as the second insulating film for interconnection 92, which consists of a DVS-BCB polymer film 92a, a DVS-BCB/BBB copolymer film 92b and a DVS-BCB film 92c. First, the DVS-BCB polymer film 92a having good mechanical strength is deposited as an interlayer insulating film for a copper via. Then, the DVS-BCB/BBB copolymer film 92b is disposed thereon. At this stage for forming the DVS-BCB/BBB copolymer film 92b, a molar feeding ratio of the DVS-BCB monomer to the BBB monomer was 1:3 to adjust a resulted content of siloxane bonds (Si—O) to about 25% or less of that in the DSV-BCB polymer film 92a. Then, in the DVS-BCB/BBB copolymer film 92b, an interconnection groove must be formed by dry etching. At the dry etching step, the DVS-BCB polymer film 92a underlying may be used as an etching stopper layer. When using a $N_2/H_2/CF_x$ etching gas for the dry etching, an etching rate thereof depends on the siloxane bond (Si—O) content in the film. Improvement in selectivity of such etching is one of the reasons why in the DVS-BCB/BBB copolymer film 92b, a siloxane bond (Si—O) content is reduced to 25% or less of that in the base DVS-BCB film 92a. In addition, as the film has a reduced dielectric constant of about 2.0, such a selection of composition therefor is also advantageous in the light of reduction in a capacitance between interconnections. On this DVS-BCB/BBB copolymer film 92b, the DVS-BCB polymer film 92c having good mechanical strength and adhesiveness is deposited. A layered film having such a structure can be also continuously deposited using the deposition apparatus for a copolymer film shown in FIG. 1, by regulating relative feeding amounts of the DVS-BCB monomer and the BBB monomer to the predetermined amounts. A via is opened in the DVS-BCB film 92a composing the insulating film for the second interconnection 92, and an interconnection groove is formed in the DVS-BCB/BBB copolymer film 92b and the DVS-BCB film 92c. Then, in the opening consisting of the interconnection groove and the via, the second layer of dual damascene type copper interconnection whose sides and bottom are coated with a TaN barrier film is formed.

After that, on the second layer of copper interconnection, an SiN film with 10 nm thickness for a barrier film to copper diffusion is deposited, and then the third interconnection insulating film 93 is grown thereon. In the insulating film for the third interconnection 93, a dual damascene copper interconnection composed of the third layer of copper interconnection 89 and a via 88 bound to the second layer of interconnection is formed. In the interlayer insulating film for the third interconnection 93, a DVS-BCB polymer film 93a having good mechanical strength is used for an interconnection via portion, a BBB polymer film 93b is used for an interconnection forming region, and a DVS-BCB film 93c having good mechanical strength is used for the top layer therein. In this case, during deposition of film, a feeding gas system is sequentially switched from 100% DVS-BCB monomer to 100% BBB monomer, and again to 100% DVS-BCB monomer. The film of BBB polymer resulted from 100% BBB monomer, which is used as an intermediate layer, contains no siloxane bonds (Si—O) and has a dielectric constant of about 2.0 to 1.8. Since there are some of the upper layer interconnections having a longer line length, an interlayer insulating film having a further lower dielectric constant is required therein. Therefore, a 100% BBB polymer film was used as the third interconnection insulating film 93b.

As described in this example, by means of a process for growth of a copolymer film according to this invention, each of contents of skeletal monomers may vary from 0% to 100% in vapor growth system for forming a copolymer film where the DVS-BCB and the BBB monomers are used as starting materials. Therefore, even when interconnection interlayer insulating films for individual interconnection layers are required having different film properties such as mechanical strength, adhesiveness and a dielectric constant as is for a ULSI multilayer interconnection, contents of skeletal monomers therein can be appropriately varied only by controlling feeding ratios of the organic monomer gases used.

Furthermore, in a system using a BBB monomer and an unsaturated-hydrocarbon-added BBB monomer as starting materials, a film having a lower bulk density can be obtained when using more amount of the unsaturated-hydrocarbon-added BBB monomer as a starting material. Therefore, its feeding amount relative to the BBB monomer may be varied to obtain a film of copolymer in which a bulk density in a film thickness direction continuously or stepwise varies, and thereby at the same time to form a film copolymer in which not only a dielectric constant but also a refractive index continuously or stepwise vary. A copolymer film having such a refractive index distribution therein can be also used in a substrate for an optical waveguide.

In the examples of deposition of a copolymer film described above, one of a plurality of organic monomers has been DVS-BCB. This invention is, however, not limited to it, and as long as an organic monomer is polymerizable alone, a plurality of such monomers may be combined to vapor-phase deposit a copolymer film whose composition varies within a wider range. For example, as long as the organic monomers have at least two mutually polymerizable active groups such as vinylene and cyclobutene groups described in Examples 1 and 2, a plurality of organic monomers of these types may be mixed to vapor-phase grow a film of copolymer composed thereof. Furthermore, to a gas mixture comprising two or more organic monomers being homopolymerizable as predominant starting materials, a promoting gas for polymerization such as acetylene and ethylene may be added to vapor-phase grow a copolymer film therewith.

INDUSTRIAL APPLICABILITY

In the process for forming a film of copolymer according to this invention, when forming a film by applying the vapor phase deposition method that is a further improvement on such a technique as the MVP method, in particular, the plasma polymerization method, of which the principle is explained above, use of a plurality of starting organic monomers as starting materials being capable of polymerizing therein allows formation of a copolymer structure comprising skeleton units derived from the plurality of monomers, and thus it provides a success in formation of a film of polymer having extensive functionality, which can be never achieved with use of a single starting monomer in the prior art. Furthermore, during a process of film growth by means of the vapor phase deposition, the regulated feeding amounts for individual starting monomers that are fed as a gas mixture thereof are independently controlled for each of the plurality of starting monomers so that in a thickness direction of the film grown, the structure of the copolymer film, specifically the content ratio (composition) of the skeletons derived from the starting monomers composing it, can be controlled in a wide range. Furthermore, taking advantage of the feature, a copolymer film formed on an interface in contact with a semiconductor material including such as a silicon oxide film, for example, on a surface of a semiconductor material used as a base at the initiation of deposition, may have a structure (composition) where a ratio of organic monomer units significantly contributing to adhesion to the semiconductor material is set to be high, which will provide an improved adhesiveness in the interface. Similarly, at the end of deposition, the surface of the film of polymer may have a structure (composition) where a ratio of organic monomer units significantly contributing to adhesion to the semiconductor material formed thereon is set to be high, which will provide an improved adhesiveness in an interface with the upper semiconductor material layer that is formed by deposition on the film of copolymer as a base. On the other hand, the middle region of the film of copolymer may have a structure (composition) different from that in said bottom (lower layer) or top surface (upper layer) of the film where a ratio of organic monomer units that facilitates in structurally reducing a density thereof is increased, which allows lowering of an effective dielectric constant of the copolymer formed in the middle region. It is, therefore, possible that an effective dielectric constant as the whole copolymer film is lowered thereby, while excellent adhesiveness to the semiconductor materials is maintained in the interfaces with the semiconductor material used as the base and with the upper semiconductor material layer formed on the polymer film surface. More specifically, films of copolymer having good mechanical strength and adhesiveness may be arranged in an interface region and a film of copolymer having a lower bulk density may be posted for an intermediate film placed therebetween so that it is easy to give an interlayer insulating film having a lower effective dielectric constant as the whole film, and being excellent in adhesiveness and mechanical strength.

What is claimed is:

1. A film of copolymer formed on a surface of a base by means of vapor phase deposition method,
   comprising a copolymer formed by copolymerization of at least two or more organic monomers, wherein the copolymer has structures retaining skeletons derived from said at least two or more organic monomers, of which at least one organic monomer has at least a structure of an openable ring; and
   having a region where an average in-plane composition thereof that is represented as a ratio of the at least two or more organic monomer units composing said copolymer varies continuously in its film thickness direction.

2. The film of copolymer as claimed in claim 1, wherein at least one or more organic monomer units of the at least two or more organic monomer units composing said copolymer have a structure of siloxane bond (Si—O) as an internal structure thereof; and
   a density of the structure of siloxane bond (Si—O) contained in the film continuously varies in its thickness direction as the average in-plane composition represented by said ratio of the organic monomer units continuously varies.

3. The film of copolymer as claimed in claim 2, wherein said continued variation in the density of the structure of siloxane bond (Si—O) contained in the film that is present in its thickness is set such that the densities of the structure of siloxane bond (Si—O) structure in the regions near the lower surface of said copolymer film being in contact with the base surface and the upper surface of the film are both high, relative to that in its middle region of the thickness.

4. The film of copolymer as claimed in any one of claims 1 to 3, wherein an average in-plane bulk density of the copolymer in the regions near the lower surface of the copolymer film being in contact with the base surface and the upper surface of the film is high, relative to that in its middle region of the thickness.

5. A film of copolymer formed on a surface of a base constituting the semiconductor device by vapor phase deposition method,
   comprising a copolymer formed by copolymerization of at least two or more organic monomers, wherein the copolymer has structures retaining skeletons derived from said at least two or more organic monomers, of which at least one organic monomer has at least a structure of an openable ring; and
   wherein at least one organic monomer unit of said at least two or more organic monomer units composing said copolymer has a structure of siloxane bond (Si—O) as its internal structure;
   the film has a layered structure in its thickness direction consisting of the upper, the intermediate and the lower layers which are distinguished from each other by difference in density of said structure of siloxane bond (Si—O) contained in the film;
   said density of the structure of siloxane bond (Si—O) is low in the intermediate layer, relative to those in said upper and lower layers; and
   the film is shaped into such a form that a copper interconnection film in said semiconductor device is buried in the film of copolymer having the layered structure.

6. A film of copolymer formed on a surface of a base constituting the semiconductor device by vapor phase deposition method,
   comprising a copolymer formed by copolymerization of at least two or more organic monomers, wherein the copolymer has structures retaining skeletons derived from said at least two or more organic monomers, of which at least one organic monomer has at least a structure of an openable ring; and
   wherein at least one organic monomer unit of the at least two or more organic monomer units composing said copolymer has a structure of siloxane bond (Si—O) as its internal structure;
   the film has a layered structure in its thickness direction consisting of the upper, the intermediate and the lower layers which are distinguished from each other by difference in density of said structure of siloxane bond (Si—O) contained in the film;
   said density of the structure of siloxane bond (Si—O) is low in the intermediate layer, relative to those in said upper and lower layers; and
   the film is shaped into such a form that a via copper film in said semiconductor device is buried in the lower layer of the film of copolymer having the layer structure and a copper interconnection film is buried in the intermediate and the upper layers thereof.

7. A semiconductor device using one or more organic polymer films as an interlayer insulating film, wherein
   at least one of the organic polymer films provided as said interlayer insulating film therein is a film of copolymer as claimed in claim 4.

8. A semiconductor device using one or more organic polymer films as an interlayer insulating film, wherein
   at least one of the organic polymer films provided as said interlayer insulating film therein is a film of copolymer as claimed in claim 5 or 6.

9. The film of copolymer as claimed in claim 1, wherein
   at least one organic monomer of said two or more organic monomers used as starting materials thereof has a structure of an openable ring and an addition-polymerizable structure of ethen-1,2-diyl (—CH═CH—) in its molecule.

10. The film of copolymer as claimed in claim 1, wherein
    at least two of said two or more organic monomers used as starting materials thereof are divinylsiloxane bis (benzocyclobutene) monomer represented by formula (I):

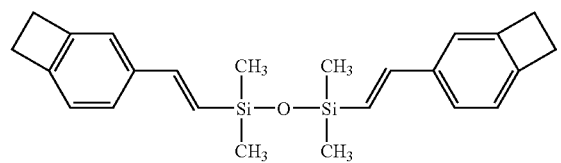

(I) divinylsiloxane bis(benzocyclobutene)
and bis(benzobutenyl)butadiene monomer represented by formula (II):

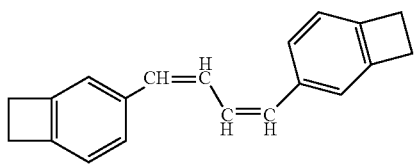

(II) bis(benzobutenyl)butadiene.

11. The film of copolymer as claimed in claim 1, wherein at least two of said two or more organic monomers used as starting materials thereof are divinylsiloxane bis(benzocyclobutene) monomer represented by formula (I):

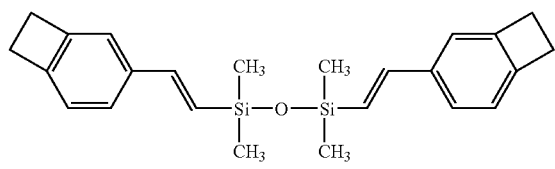

(I) divinylsiloxane bis(benzocyclobutene)

and bis(benzobutenyl)butadiene derivative monomer represented by general formula (III):

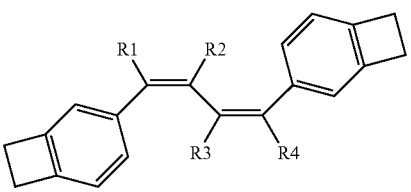

(III) bis(benzobutenyl)butadiene derivative where R1, R2, R3 and R4 independently represent hydrogen or unsaturated hydrocarbon group.

* * * * *